(12) United States Patent
Dervisoglu et al.

(10) Patent No.: US 7,200,784 B2
(45) Date of Patent: *Apr. 3, 2007

(54) ACCELERATED SCAN CIRCUITRY AND METHOD FOR REDUCING SCAN TEST DATA VOLUME AND EXECUTION TIME

(75) Inventors: Bulent Dervisoglu, Mountain View, CA (US); Laurence H. Cooke, Los Gatos, CA (US)

(73) Assignee: On-Chip Technologies, Inc., Los Gatos, CA (US)

( * ) Notice: Subject to any disclaimer, the term of this patent is extended or adjusted under 35 U.S.C. 154(b) by 316 days.

This patent is subject to a terminal disclaimer.

(21) Appl. No.: 10/931,191

(22) Filed: Sep. 1, 2004

(65) Prior Publication Data

US 2005/0154948 A1    Jul. 14, 2005

Related U.S. Application Data

(60) Division of application No. 10/750,949, filed on Jan. 5, 2004, now abandoned, which is a continuation-in-part of application No. 10/351,276, filed on Jan. 24, 2003.

(51) Int. Cl.
  *G01R 31/28* (2006.01)
(52) U.S. Cl. ...................... 714/731; 714/744
(58) Field of Classification Search ............ 714/727, 714/731, 744
  See application file for complete search history.

(56) References Cited

U.S. PATENT DOCUMENTS 3,784,907 A    1/1974  Eichelberger
4,495,629 A    1/1985  Zasio et al.
4,503,537 A    3/1985  McAnney (Continued)

OTHER PUBLICATIONS

V. Agrawal et al., "A Tutorial on Built-In Self-Test, Part 1: Principles," IEEE Design & Test of Computers, pp. 73-82, Mar. 1993.

(Continued)

*Primary Examiner*—Albert Decady
*Assistant Examiner*—Mujtaba K. Chaudry
(74) *Attorney, Agent, or Firm*—Connolly Bove Lodge & Hutz LLP; Jeffrey W. Gluck

(57) ABSTRACT

An architecture and methodology for test data compression using combinational functions to provide serial coupling between consecutive segments of a scan-chain are described. Compressed serial-scan sequences are derived starting from scan state identifying desired Care_In values and using symbolic computations iteratively in order to determine the necessary previous scan-chain state until computed previous scan-chain state matches given known starting scan-chain state. A novel design for a new flip-flop is also presented that allows implementing scan-chains that can be easily started and stopped without requiring an additional control signal. Extensions of the architecture and methodology are discussed to handle unknown (X) values in scan-chains, proper clocking of compressed data into multiple scan-chains, the use of a data-spreading network and the use of a pseudo-random signal generator to feed the segmented scan-chains in order to implement Built In Self Test (BIST).

7 Claims, 32 Drawing Sheets

U.S. PATENT DOCUMENTS

| | | | |
|---|---|---|---|
| 5,109,383 A * | 4/1992 | Chujo | 714/726 |
| 5,838,693 A * | 11/1998 | Morley | 714/726 |
| 5,991,909 A | 11/1999 | Rajski et al. | |
| 6,237,122 B1 | 5/2001 | Maki | |
| 6,324,652 B1 * | 11/2001 | Henderson et al. | 713/500 |
| 6,448,829 B1 * | 9/2002 | Saraf | 327/200 |
| 6,606,713 B1 | 8/2003 | Kubo | |
| 2002/0194565 A1 | 12/2002 | Arabi | |

OTHER PUBLICATIONS

V. Agrawal et al., "A Tutorial on Built-In Self-Test, Part 2: Applications," IEEE Design & Test of Computers, pp. 69-77, Jun. 1993.

C. Barnhart et al., "OPMISR: The Foundation for Compressed ATPG Vectors," IEEE ITC International Test Conference, Paper 27.4, pp. 748-757, Oct. 30-Nov. 1, 2001.

* cited by examiner

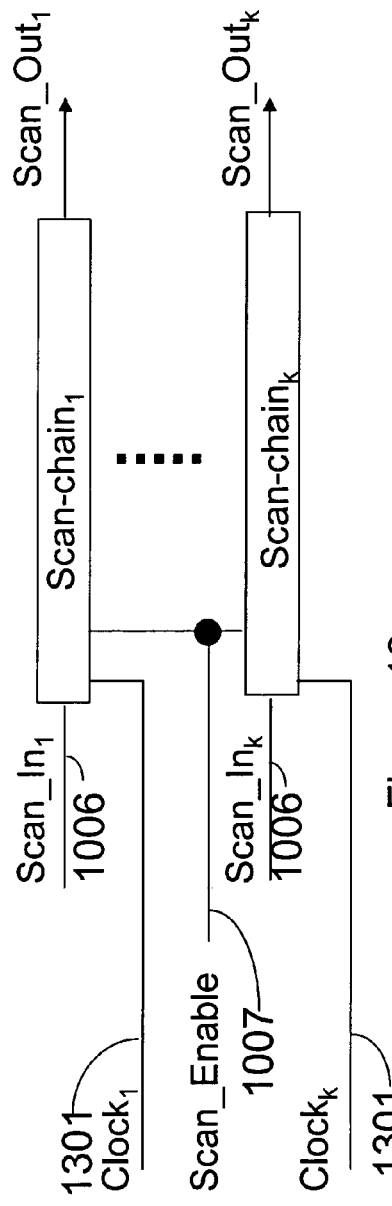
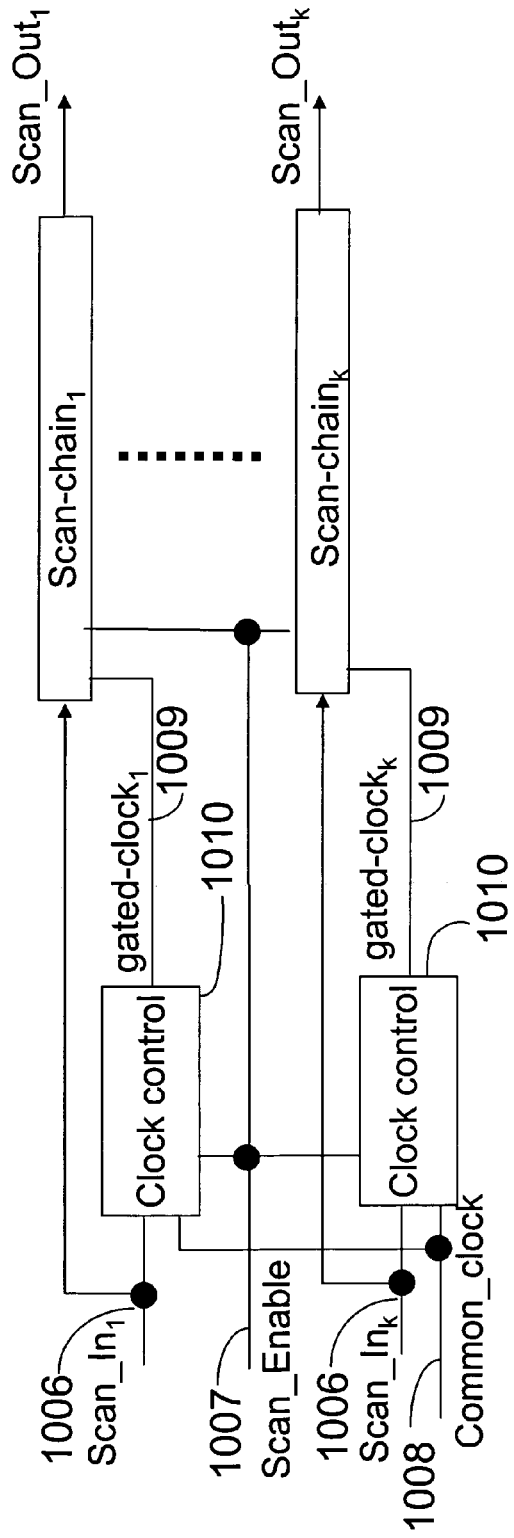

ACCELERATED SCAN CIRCUITRY AND METHOD FOR REDUCING SCAN TEST DATA VOLUME AND EXECUTION TIME

CROSS-REFERENCE TO RELATED APPLICATION

This application is a division of U.S. patent application Ser. No. 10/750,949, entitled, "ACCELERATED SCAN CIRCUITRY AND METHOD FOR REDUCING SCAN TEST DATA VOLUME AND EXECUTION TIME," filed on Jan. 5, 2004, now abandoned which is a continuation-in-part of U.S. patent application Ser. No. 10/351,276, entitled, "VARIABLE CLOCK SCAN TEST CIRCUITRY AND METHOD," filed on Jan. 24, 2003, both of which are commonly assigned and incorporated herein by reference.

FIELD OF THE INVENTION

The present invention is related to digital logic testing, particularly additions to scan based digital logic testing, which uses check-sum or signature register logic and exclusive-OR operations on serial shift string logic, and software techniques to reduce test data volume and minimize test time.

BACKGROUND AND SUMMARY OF THE INVENTION

Scan-based testing, as described in as described by Eichelberg in U.S. Pat. No. 3,784,907, and Zasio et al. in U.S. Pat. No. 4,495,629, has been the staple of Design for Testability methodology for over 30 years. The technique drives its strength from its ability to replace the state variables (i.e. flip-flops) that make up a sequential circuit by pseudo inputs and outputs whose values can be set arbitrarily or be observed by connecting the memory elements in a serial shift register configuration. Since serial shift (i.e. scan) actions can be employed to set the flip-flops of the Circuit Under Test (CUT) to any arbitrary set of values, the process transforms a sequential circuit into a virtual combinational circuit where Scan_In and Scan_Out activities are defined as macro operations to set (i.e. control) and observe the state variables of the CUT. Using this methodology, Scan_In is performed to apply the inputs at the pseudo-input pins of the CUT, followed by a Capture operation, which captures the response of the CUT to the input values. Next, Scan_Out is employed to read out the captured results at the memory elements that are used to implement the state variables. Furthermore, Scan_Out of the captured test results for a previous test can be overlapped with the Scan_In of the input values for the next test in order to reduce some of the time overhead of scan-based testing.

As scan technology has enabled transforming the problem of sequential test pattern generation into the much easier problem of test pattern generation for a combinational circuit it has led to the development of very efficient combinational ATPG algorithms. However, with increasing circuit complexity, which is often measured in terms of the number of state variables (i.e. flip-flops or latches used to implement it) the total number of serial bits that have to be scanned in and out in serial fashion has become a problem. To combat this problem, designers have reverted to implementing parallel scan whereby the overall scan chain is broken into a number of independently operable serial scan chains so that the effective serial scan overhead can be reduced by a factor that is equal to the number of parallel scan chains. For example, a 100,000-bit serial scan chain may be implemented as 10, independently operable scan chains of 10,000 bits each and thereby reduce the total number of shift cycles necessary to load/unload all of the 100,000 bits by a factor of 10.

Parallel scan can help alleviate some of the serial scan, but test time issues limit its effectiveness to the number of independently operable scan chains that can be implemented on a target Integrated Circuit (IC). Each independent scan chain requires a pair of Scan_In/Scan_Out pins that are directly accessible using the primary I/O pins of the IC. Most IC's are limited by the number of their I/O pins that are available for scan and other test purposes. Parallel scan can be implemented using a sharing of some of the primary I/O pins between their functional and Scan roles. Unfortunately, shared I/O pins impact the target IC's maximum operating speed. Furthermore, it is not possible to take advantage of parallel scan unless the Automatic Test Equipment (ATE) that will be used to test the target IC has the ability to feed and observe data on the parallel scan channels simultaneously. As might be expected, often the ATE imposed limit on the independently operable scan chains is more severe than the limit imposed by the target IC designer. In addition to its limitations as described above, parallel scan, does not address a crucial issue. Whether a single, serial scan or an n-channel parallel scan architecture is used, the total number of bits of data that need to be scanned-in and scanned-out for each ATPG vector remains the same. Today, it is not unreasonable to expect a complex IC to contain close to 1M flip-flops that are scanable. Considering that for each ATPG vector we may need an input vector, an (expected) output vector, and (possibly) a mask vector to indicate whether an output bit value may be used reliably, $2K \times 1M \times 3/8 = 750$ MB of high-speed ATE memory may be required to hold all of the test patterns and the expected results. The total volume of test related data and the need for increased physical bandwidth (i.e. number of externally controllable parallel scan chains) are fast becoming dominant factors in determining overall test cost of complex ICs. The concerns described above have made it desirable to reduce the total data volume needed for scan-based ATPG. To this end, a crucial observation has been made that for any given ATPG vector only a very small percentage of the total number of scanable bits are needed to be set to deterministic values; the vast majority of the scanable bits are free and can be (are) set to pseudorandom values to achieve additional incidental fault coverage. The ATPG program sets these bits to logic 1 or logic 0 values, but their specific values are not critical and another set of pseudo random values may also be employed without any appreciable change in fault coverage. This observation has led to the development of techniques that focus on data compression of the scan vectors whereby the pre-determined bit values are preserved while the pseudo random values can be filled in a manner to achieve greater data compression. For example, U.S. Pat. No. 6,327,687, by Rajski et al. describes such a technique.

The primary goal in test data compression for scan-based testing using ATPG vectors is to store sufficient information off the chip (i.e. on the ATE) that allows setting pre-determined bit positions of each scan vector to their ATPG-determined values while setting the remaining bit positions to values that aid in maximum data compression. Characteristic of all state-of-art techniques to achieve this is that they achieve their objective while length (i.e. number of clock cycles) for the scan operations remains unchanged before and after test data compression. This has been deemed necessary since scan in of input values for the present test vector is overlapped with scan out of test results from the previous test vector such that the two lengths need to be equal; Extending this requirement over the entire test vector set is achieved by keeping the scan-length be constant over the entire test set. In this case, reduction of scan test data volume can only be achieved by scanning a seed value into a data decompressor network that receives the shorter-length seed values in order to produce the actual values to be fed into the scan chains. Typically, the decompressor network is based on an LFSR which is implemented inside the target device under test (DUT) and a set of simultaneous EXOR-equations need to be solved to determine the seed values to be fed into the LFSR circuit during test.

A recent U.S. patent application Ser. No. 10/351,276, filed Jan. 24, 2003, describes a different approach that is based on a technique whereby the hereto unquestioned overlapping of the scan-in and scan-out operations is considered separately from each other. One aspect of the new technique is driven by the observation that, even after compaction, only a very a small percentage (less than 2%) of bit values of each ATPG-generated scan-test vectors are set to pre-determined values (called Care_In values) while the remaining bits are set to pseudorandom values with hopes of achieving increased incidental coverage. In similar fashion, Care_Out positions are defined as bit positions along a scan-chain that contain pre-determined test results that are indicative of the pass/fail nature of tests executed by previous test vector. Similar to the small number of Care_In positions for each test vector, there are only a small percentage of Care_Out positions for each given result vector. Separation of the scan in and scan out operations from each other enables using this fact in reformulating the scan in problem as:

Given the present-state of values along a scan chain, find an efficient way to set all Care_In positions to pre-determined values without concern about values achieved in other, non-Care_In bit positions. Similarly, the scan out problem can be reformulated as:

Given the set of test results along a scan chain, find a cost-efficient structure to observe all of the Care_Out values, either directly or using a MISR.

As with the previous U.S. patent application Ser. No. 10/351,276, filed Jan. 24, 2003, a unique advantage of the present invention is, the separation of Scan_In and Scan_Out problems from one another, which leads to a very effective solution to the problem of reducing data volume and test time for scan-based testing of IC's. The present invention extends the previous Application, with improved methods for computing such compressed test vectors and with improved circuitry that eases its implementation in hardware.

While reading the remainder of the descriptions, it is useful to focus on number of cycles for the Scan_In and Scan_Out operations, in the remainder of this patent, the inventors are using this terminology as a semaphore for the volume of test-related data since, for a given number of externally accessible Scan_In/Scan_Out ports, a smaller number of scan cycles implies less data volume.

BRIEF DESCRIPTION OF THE DRAWINGS

FIG. 5c shows the scan-chain value after the second shift cycle. FIG. 5d shows the scan-chain value after the third shift cycle. FIG. 5e shows the scan-chain value after the fourth shift cycle. FIG. 5f shows the scan-chain value after the fifth shift cycle and shows that the desired Care_In values have been achieved.

FIG. 6e shows the scan-chain in FIG. 6d after the next shift cycle. FIG. 6e shows the scan-chain state after 5 shift cycles along with all of the EXOR equations that have been generated.; This example demonstrates that setting the symbolic values so that A=0, B=1, C=1, D=0, E=1 satisfies the conditions represented by the EXOR equations well as achieving the desired values in the Care_In positions. Therefore, the 5-bit serial input sequence of E, D, C, B, A=1, 0, 1, 1, 0 (value for A is fed into the scan-chain first) achieves the Care_In values in the 10-bit long scan-chain.

FIG. 7a shows the desired scan-chain state where only the Care_In values are specified and all other bits are set to Don't_Care values. FIG. 7a also shows what the previous state of the scan-chain should have been in order that once shift cycle later the desired present state of the scan-chain is obtained. FIG. 7b shows the computed previous scan-chain state for reverse-shift of 2 cycles of the preferred algorithm. FIG. 7c shows the computed previous scan-chain state for reverse-shift of 3 cycles of the preferred algorithm. FIG. 7d shows the computed previous scan-chain state for reverse-shift of 4 cycles of the preferred algorithm. FIG. 7e shows the computed previous scan-chain state for reverse-shift of 5 cycles of the preferred algorithm, and FIG. 7e also shows that using only two symbolic variables (A and B) and without generating any EXOR equations to be solved, the reverse-shift algorithm discovers the same 5-bit compressed Scan_In sequence for the same example demonstrated in FIG. 6.

FIG. 13 illustrates three different techniques for controlling the clocking of the individual scan-chains that are operated in parallel. FIG. 13a shows the preferred embodiment of a technique for controlling the clocking of the individual scan-chains that are operated in parallel using a common Scan_Enable signal 1007 and individual clocks 1301 to control the separate scan-chains.

FIG. 13b illustrates another preferred embodiment of a technique for controlling the clocking of the individual scan-chains that are operated in parallel, using a common Scan_Enable signal 1007 and individual clock control circuits 1010 to generate gated clocks 1009.

FIG. 15a shows the preferred embodiment of a circuit that generates the SE/CLKA signal for use by the flip-flops as well as showing how to connect multiple flip-flops together to form a single scan-chain. FIG. 15b shows a timing diagram for the operation of circuit in FIG. 15a.

FIG. 16b shows the details of a blocking circuit that may be used in FIG. 16a.

DESCRIPTION OF SPECIFIC EMBODIMENTS

Figure 1:
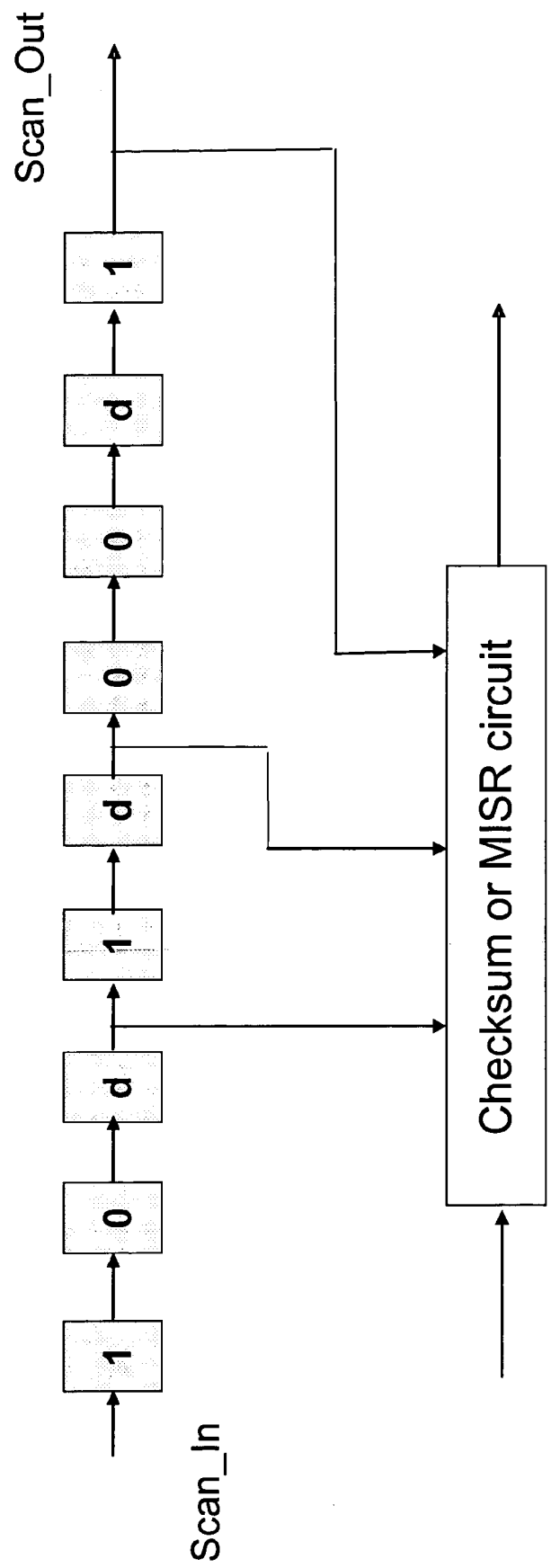
FIG. 1 shows a sample scan-chain that uses the usual pair of Scan_In and Scan_Out ports as well as using additional output taps from several positions along the scan-chain to feed data into a Checksum or Multi Input Signature Register (MISR).

Traditional approach to scan-based testing employs overlapped Scan_Out of the results for the most recently executes test pattern with the Scan_In for the next test pattern. The primary motivation for doing so has been to take advantage of the ability to feed new serial data (i.e. next test pattern) at one end of the scan-chain while simultaneously receiving the results for the previous test pattern since the two serial streams are of equal length. However, scan-out bits do not all contain useful information regarding the pass/fail status of the previous test vector. Indeed, the only bits where useful information is present are bit positions where at least one fault effect has been propagated. Thus, it is only useful (necessary) to scan-out those bit positions that contain useful information. Here, those bits are referred to as Care_Out bits. It is noted that, typically, each test results vector may contain a small number of Care_Out bits. The remaining bits become set to specific values (0 or 1). These values may not carry any additional information about any faults in the circuit under test. Furthermore, Scan_Out of the Care_Out values can be speeded-up (i.e. the number of Scan_Out cycles can be reduced) by using multiple primary output pins where Scan_Out values can be observed in order to increase the Scan_Out bandwidth. These two concepts can be used together so that, in a preferred embodiment of the present invention, serial Scan_Out operations are continued until all Care_Out bits have been observed at least at one primary output pin. Scan_Out values observed at multiple pin positions can be combined using a checksum circuit whose output reflects the overall (composite) Scan_Out value for the given scan-chain. Alternately, the multiple output pins may be connected to a Multi-Input Signature Register (MISR) where they contribute to an overall signature value, which can be read out at a later point in time. This is illustrated in FIG. 1.

While the Scan_Out values are being scanned-out, other bits of the scan chain will also be observed and reflected either in the checksum or in the MISR. For example, consider the case where the results vector contains a first Care_Out bit position (not necessarily the first bit position along the scan-chain) and a last Care_Out bit position (not necessarily the last bit position along the scan-chain) where test results information is present. In one approach, scan-out operations may be continued until all scan bits between the Serial_In and Serial_Out (i.e. the first and the last bit positions) have been observed at least on one primary output pin. In this case, the number of shift cycles needs to be at least as large as the total number of bits along the scan register and upon completion of the scan operations all bits along the scan register shall have been observed. In another approach, the scan-out process may be stopped at any time after all Care_Out bits for the present results-vector have been observed on at least one primary output pin. In this case the number of shift cycles needs to be larger than the positional difference between the last Care_Out bit and the first Care_Out bit so that not all bits of the scan-chain may have been observed before serial shifting is stopped. However, since all Care_Out bits have been observed, no loss of test data would occur due to skipping the other bits. Furthermore, the second approach may preferred since it may require fewer total number of shift cycles necessary to observe the test results. Traditional scan-based approaches have failed to take advantage of this property. One reason for this has been that since all bits need to be scanned-in for the next test vector (i.e. the Scan_In sequence) there is no advantage in not performing a complete scan-out of the previous test-results vector. The present invention describes a new scan architecture that does not require scanning pre-determined values into all of the scan positions. By eliminating the one-to-one overlapping of the Scan_In and Scan_Out present invention achieves superior data and time compression of scan-based test operation.

It is well known to those experienced in IC testing methods that a vast majority of the input bits in scan-based test vectors are set to pseudorandom values during Automatic Test Pattern Generation (ATPG) that is typically executed using a standard Electronic Design Automation (EDA) tool. Stated in the reverse, for a given scan-based test vector, only a very small percentage of the scan-in bit positions are actually set to predetermined values. Typically, even after maximum test vector compaction, about 2% to 5% of the individual bit positions end up having been set to predetermined values. The remainders of the bit positions are set to pseudorandom values with hopes that these values may contribute to additional (incidental) fault coverage. Indeed, most ATPG tools offer the ability to fill these unselected bits to logic values that may help overall fault coverage, or that may reduce power dissipation during scan, or to help in data compression for the scan vectors. The unselected bit positions are also referred to as the Don't_Care positions. The present invention describes an approach that is aimed at taking advantage of the Don't_Care nature of the majority of the bit positions in order to fill all of the Care_In bit positions with their prescribed values by using as few serial shift cycles as possible. As part of this process, the Don't_Care bits will be set to certain values but there is no assurance that these values shall satisfy some characteristic, such as repeating values, mostly set to logic 0, etc; Still, the present invention describes a method to satisfy the overall objective of setting all of the Care_In bit values to their prescribed values using as few shift cycles as possible.

Figure 2:
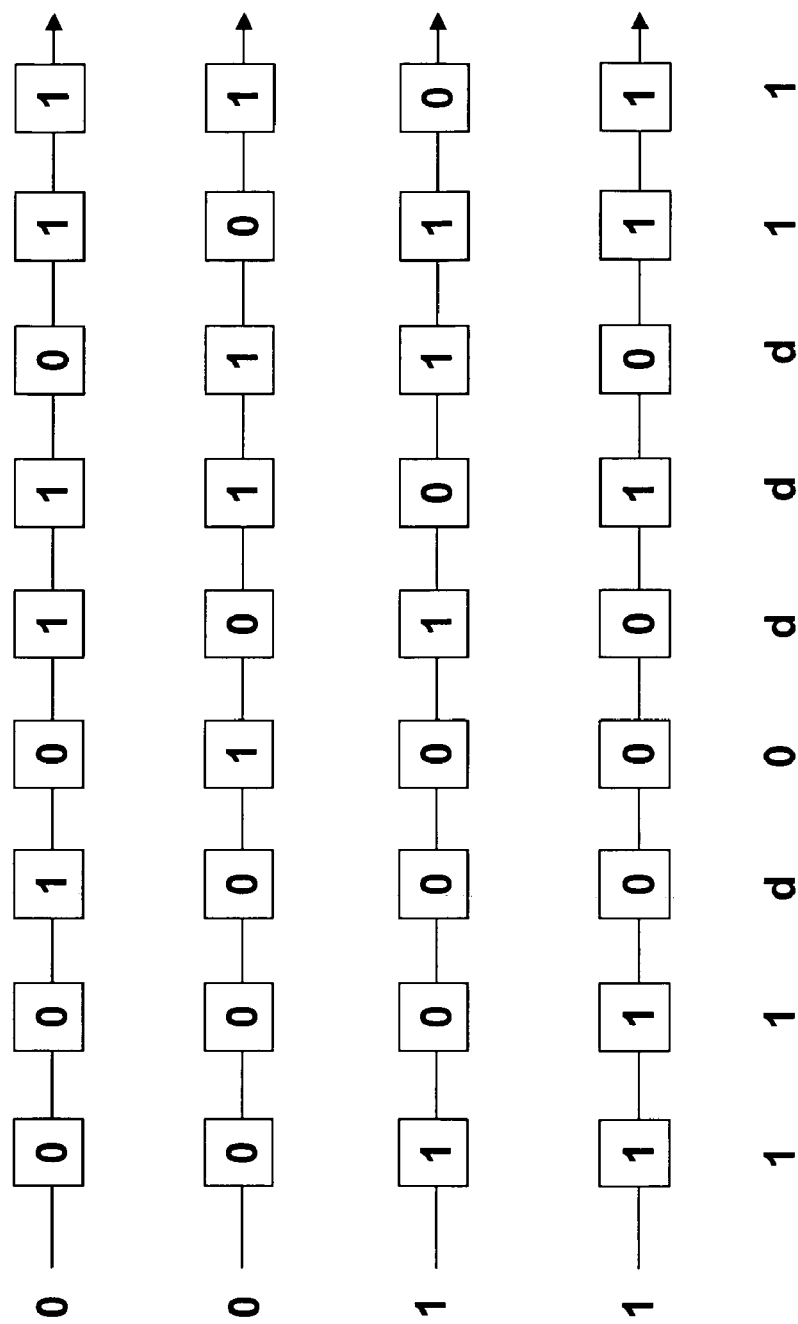
FIG. 2 shows an example to demonstrate opportunistic scan whereby present values along the scan-chain may become used in achieving desired values in all of the Care_In positions while other non-Care_In positions may be set to some other values.

Using traditional serial scan, each bit position of the scan chain receives its next value from the present value of the previous bit position while the first bit receives its next value from the external Scan_In port. Therefore, one way to view the Scan_In operation is to focus on how to get the desired values into the previous bit positions so that they may subsequently be shifted upstream into the desired Care_In positions. For example, consider the case where the Care_In positions are equally spaced at, say, every $100^{th}$ bit position along the serial scan chain. If, at some previous point in time, the present state of the serial scan chain is such that, say, the $13^{th}$, $87^{th}$, $187^{th}$, and so on, bit positions already contain the desired values (i.e. the Care_In values) for the $100^{th}$, $200^{th}$, $300^{th}$, and so on, bit position, then it will be known that 87 (100−13=87) more shift cycles are needed to set all of the Care_In positions to their desired Scan_In values. Ordinarily, the probability of success with such an opportunistic approach may not be very high. However, chances are improved when the number of Care_In positions becomes much smaller compared to the total number of bits along the serial scan chain. FIG. 2 illustrates this idea with an example.

Figure 3:
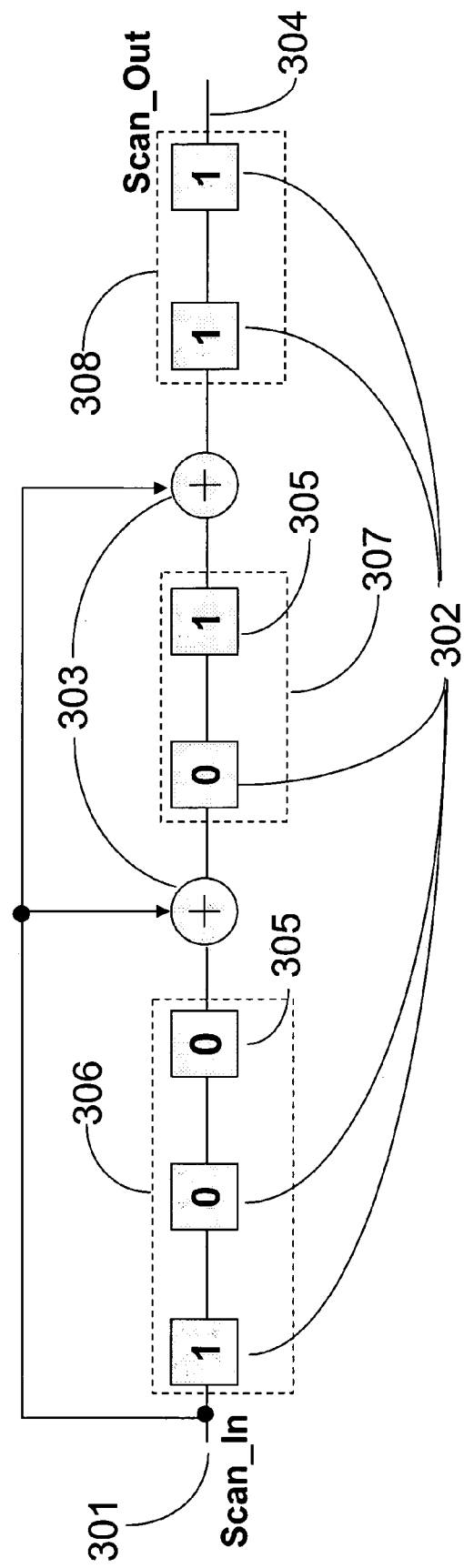
FIG. 3 shows an example of an embodiment for a multi-segmented scan-chain where each successive scan-segment is coupled to the previous segments using exclusive-or (EXOR) gates that use the common serial input value and the value from the last bit of the previous segment to be used as serial input to the first bit position of the next segment.

Traditional scan architecture requires Scan_In data to pass through all of the intervening bits between the Scan_In port and the final destination bit position during successive shift cycles. Thus, the total number of shift cycles necessary to load the last bit position (i.e. bit position that is farthest away from the Scan_In position) with the serial Scan_In data value determines the total shift count for all bits to be set to their final, desired values. An alternate scan structure is depicted in FIG. 3 where the overall serial scan-chain is broken into a number of serial scan segments and a common Scan_In signal (301) is used to affect the serial input into each of the multiple scan segments. The primary advantage of this scheme is that it allows the Scan_In value to bypass long sequences of successive bit positions (302, 305) between the Scan_In and the input to each scan segment. As shown in FIG. 3, this is achieved by merging the serial Scan_In value with the value from the last bit position from the previous scan segment using a combinational function, such as an Exclusive-Or (EXOR) gate (303). A useful property of the EXOR gate is that it implements an information lossless function that enables controlling the destination bit value through a combination of both the serial Scan_In and the value of the previous bit position. Since the previous bit positions themselves are determined by earlier values of the Scan_In signal, it is clear that the Scan_In value can be used to control all bit positions along the scan-chain. Thus, FIG. 3 represents a preferred embodiment of a characteristic of the present invention where successive scan segments are coupled together using an EXOR gate (303) where first input of the EXOR gate is connected to Scan_In (301) and second input of EXOR gate (303) is connected to output of last bit position (305) of previous segment. Indeed, it is not essential to limit this structure to using only the last bit position from the previous scan segment. Any number and combination of previous bits positions may be used to determine the value to be loaded into the serial input to the next segment of the scan-chain. Similarly, any other merging function can be used in place of the information lossless network that has been implemented using the EXOR function. However, using a common serial Scan_In value that is Exclusive-Or'ed (EXOR) with the last bit of the previous scan segment as the serial input to the next scan segment is preferred embodiment that is both simple and very effective.

The goal in performing Scan_In operations is to set all Care_In positions along the scan chain to pre-determined values by feeding serial data from a predetermined port, called the Scan_In port (301). This requires that an information lossless connection should exist between the Scan_In port and the bit positions (302, 305) along the scan chain. This is an essential requirement for any scan architecture since it makes it possible to load any combination of bit values into the scan-chain. Otherwise, any bit permutation that cannot be loaded into the scan-chain represents a test pattern that cannot be loaded into the scan-chain and thus cannot be applied to the Circuit Under Test (CUT). It is obvious that the traditional scan structure, implemented as an ordinary serial shift register, provides an information lossless path between the Scan_In port and any bit position along the scan-chain since all bit positions along the shift register can be loaded with the desired values by feeding these values in serial fashion to the scan-chain such that value desired at bit position "i" is applied to the Scan_In port during the "i-th" shift cycle. Even if there may be logic inversions along the scan-chain, knowledge of the number of logic inversions between the Scan_In port and the particular bit position enables counteracting the inversion effects by choosing also to invert or leave unchanged the Scan_In values at appropriate shift cycles.

Figure 4:
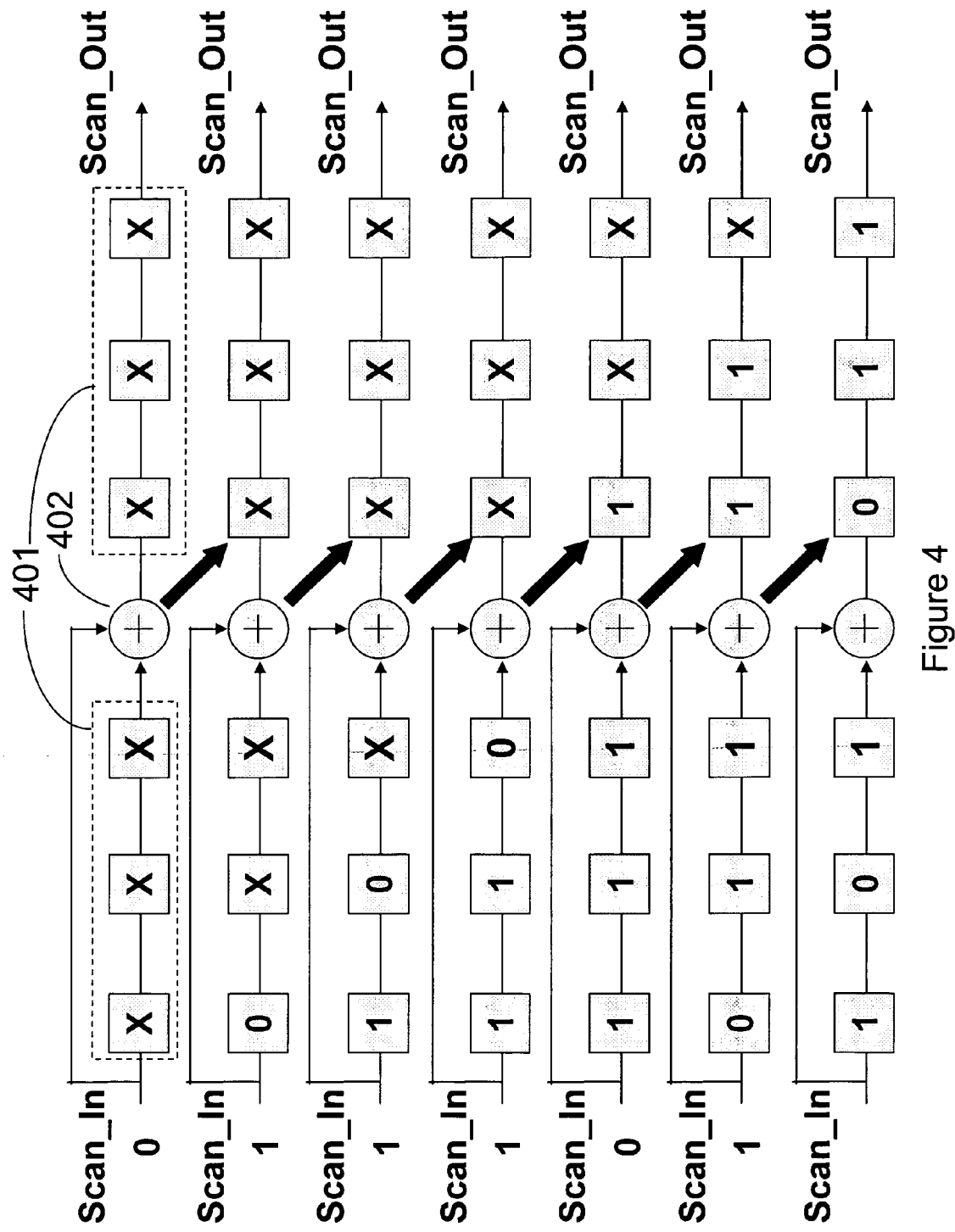
FIG. 4 shows multiple cycles of operation using a multiple-segmented scan-chain, which is used with opportunistic scan to achieve desired values in the Care_In positions.

FIG. 4 demonstrates using a multiple-segmented scan-chain and taking advantage of opportunistic scan. In practice, scan-chains of much longer lengths are used, but for simplicity of explanations, FIG. 4 uses a single 6-bit scan-chain that has been broken into 2, equal-length (i.e. 3 bits each) scan segments that are coupled using an Exclusive-OR (EXOR) gate. It can be shown that, regardless of its starting state, the 6-bit scan-chain shown in FIG. 4 can be set to any arbitrarily selected values using at most 6 shift cycles. To see this, first, it is observed that the final set of values loaded into the first segment (S1) is the last three values applied at Scan_In. Thus, if it is desired that the scan-chain be loaded with binary values of 101011, the last three scan cycles should be executed with the Scan_In values set to 101. Furthermore, during the last 3 bits of scan, the previous values in segment S1 are Exclusive-Or'ed with the Scan_In values (i.e. 101) and loaded into the second segment (S2). Since the desired values in segment S2 are 011, and the incoming Scan_In values are 101, it follows that segment S1 must contain 011 (+) 101=110 at the start of the last 3 scan cycle In other words, 110 must have been scanned in during the first 3 shift cycles, to be followed by scanning in 101. This way, serial scan of 101110 will result in setting the scan-chain to 101011. In general, if it is desired to set the two segments to values S1 and S2, respectively, serial Scan_In vector must be set to values defined by S1, S2 (+) S1. Since, S1 and S2 can be selected arbitrarily, this proves that any selection sets of values can be loaded into segments S1 and S2.

The above analysis can be extended to the case where the serial scan-chain has been broken into more than 2 segments as well as having segments of unequal lengths and still show that any set of arbitrarily selected values can be loaded into the scan-chain without regard to its initial state and using no more than "n" shift cycles where "n" is the total number of bits along the entire scan-chain. A scan-chain that implements scan function with the above characteristics is termed complete. Furthermore, the analysis can be extended to show that this characteristic remains true even if the merging functions between the segments have been implemented using any number of bits from the previous segment that are fed into an information-lossless circuit whose output drives the input to the next segment. As long as all bit positions that feed into bit position "i" come before bit position "i" and their values (optionally also including the serial Scan_In value) are combined together using an information lossless circuit (such as an Exclusive-Or gate) the resulting Scan_In function remains complete. Traditional serial scan-chain implements a limiting case of the general complete scan function where the number of segments is equal to 1.

For any scan-chain that is complete, in other words an information lossless path exists between the Scan_In port and any bit position along the scan-chain, it is not necessary to know the present state of the scan-chain in order to be able to set the scan-chain to an arbitrary new state using at most the number of Scan_In cycles that equals the length of the scan-chain, but a more useful characteristic of the scan architecture prescribed by the present invention is that it allows using the knowledge of the present state of the scan-chain in coming up with an even shorter length scan operation in order to load the Care_In values with desired (e.g. pre-determined) values. To see how this may be possible, first consider the normal (state-of-art) Scan_In operation and consider the state of the scan-chain just one cycle before completing the Scan_In operations. At that time, each present bit value will have been set to the desired target value of the next bit that follows it. In this case, a single shift cycle is all that is necessary to load all target values into their appropriate bit positions. Thus, if the state of the scan-chain one cycle prior to final, desired state is the same as the known starting state of the scan-chain, only a single bit of scan will be needed to load all bits with their final, desired values. The probability of such a situation arising in practice is small, but other considerations may ease the situation. First, given a scan-chain of "L" bits (i.e. having "L" bit positions), any shift sequence of length less than "L" to set all bits of the scan-chain to their desired values is preferred over full-scan, which requires exactly "L" shift cycles. Furthermore, not all bit positions of the scan-chain may need to be set to predetermined values. This will have a positive impact on the probability and length of a serial Scan_In sequence of fewer than "L" bits to set all Care_In bit positions with their targeted values. As stated earlier, scan-based ATPG algorithms typically generate test vectors where a small percentage of the bits represent Care_In values and the others are filled in random fashion. Obviously, the fewer the conditions that need to be met (i.e. the smaller the number of Care_In values that need to be set to predetermined values) the easier it is to set the scan-chain to a state where all Care_In positions have been set to their target. Additionally, and more importantly, bit positions, which are non-Care_In positions, can be set to the values that make them usable as input sources to set, at least some of, the Care_In positions. This is made possible due to the unique scan-chain architecture described here where each bit position may be used to control the values provided to other bit positions which are downstream along the scan-chain. When a bit position reaches the input of an EXOR gate connecting two scan-chain segments, it is used to pass either the serial Scan_In value or its complement downstream. This way the same Scan_In value is passed in true or complemented form at multiple bit positions (i.e. at each EXOR position) including the serial input to the scan-chain. This creates the opportunity to us a single Scan_In value to create different values at multiple positions of the scan-chain if one can control (or have knowledge of) the given values of the scan-chain bits that are also connected to the EXOR gates. This way it may be possible first to fill some of the non-Care_In positions with certain bit values so that when these values reach the inputs to the EXOR gates, the Scan_In input can be used to fill multiple bit positions with selected values. Since the number of Care_In positions is a small percentage of the total number of bits along the scan-chain, there are many non-Care_In positions that can be used in this fashion. This increases flexibility and makes it more likely that shorter-length Scan_In sequences can be found to fill all of the Care_In bit positions with pre-determined values while other bits may be filled with supporting values.

Figure 5A:
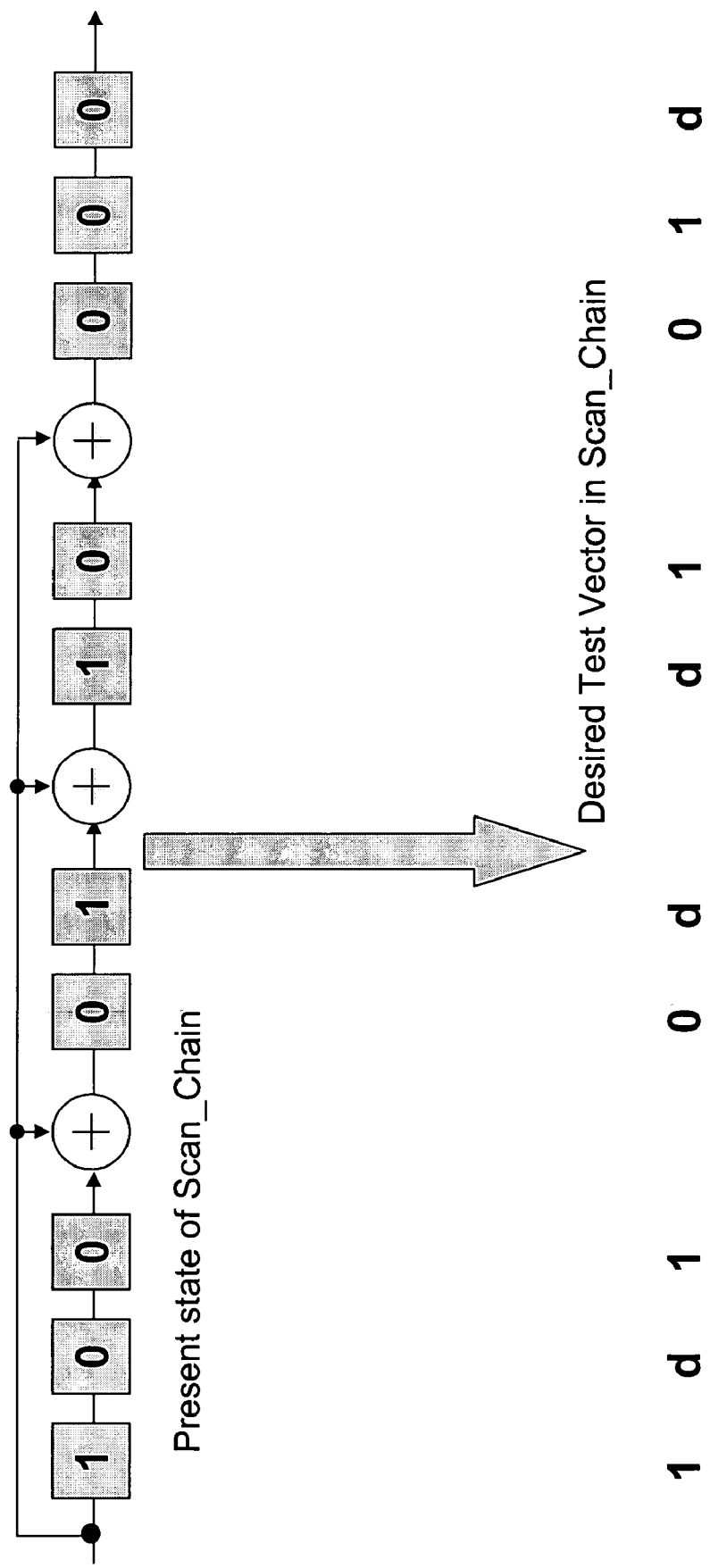
FIG. 5a shows the initial state for an example that uses a 4-segmented scan-chain and shows the desired Care_In values that are intended.
Figure 5B:
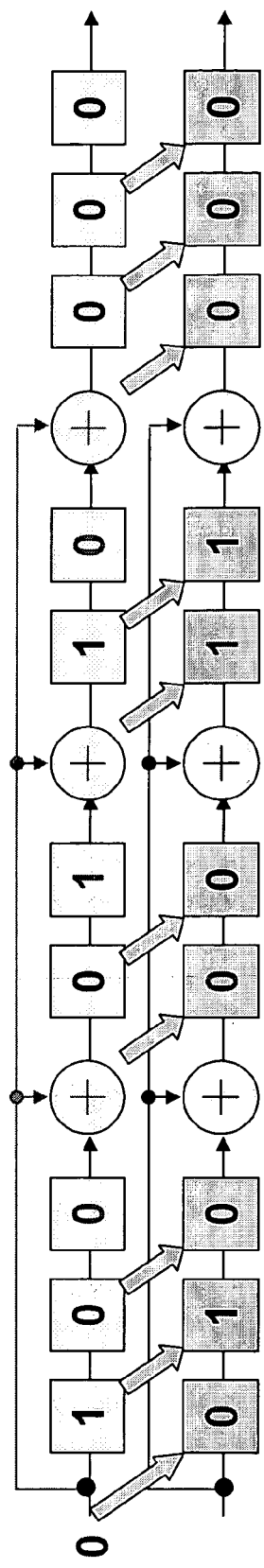
FIGS. 5b through 5f shows the scan-chain values after each of the next 5 shift cycles.
Figure 5C:
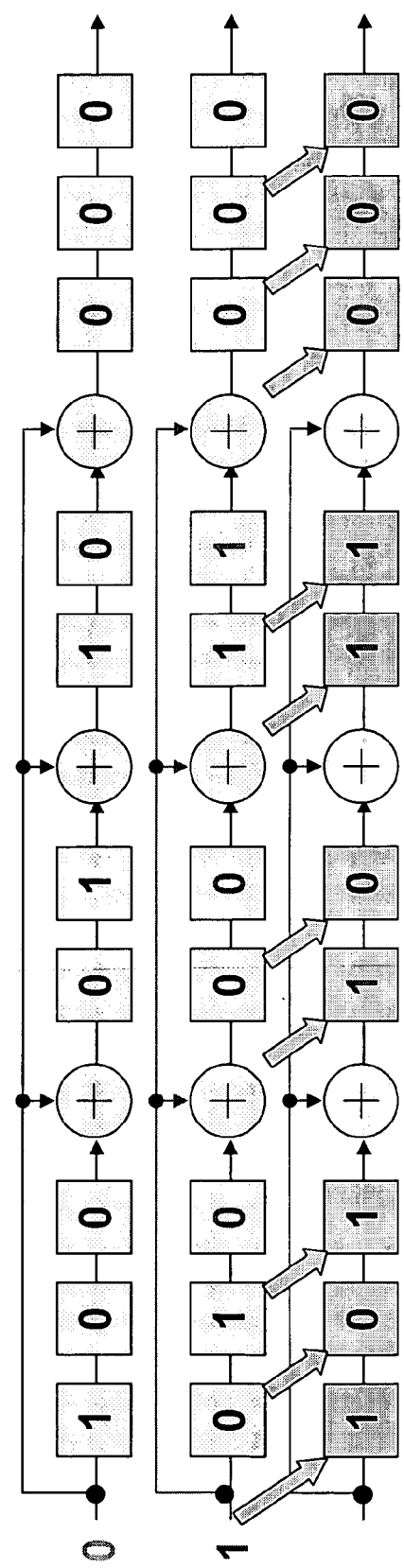
Figure 5D:
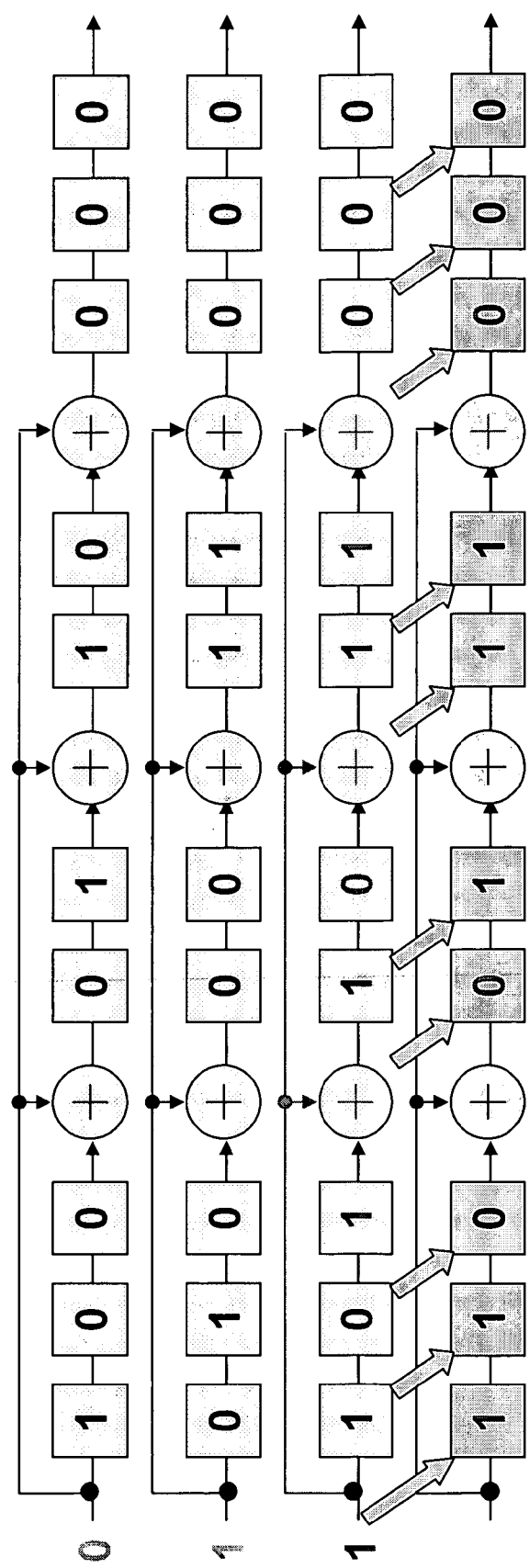
Figure 5E:
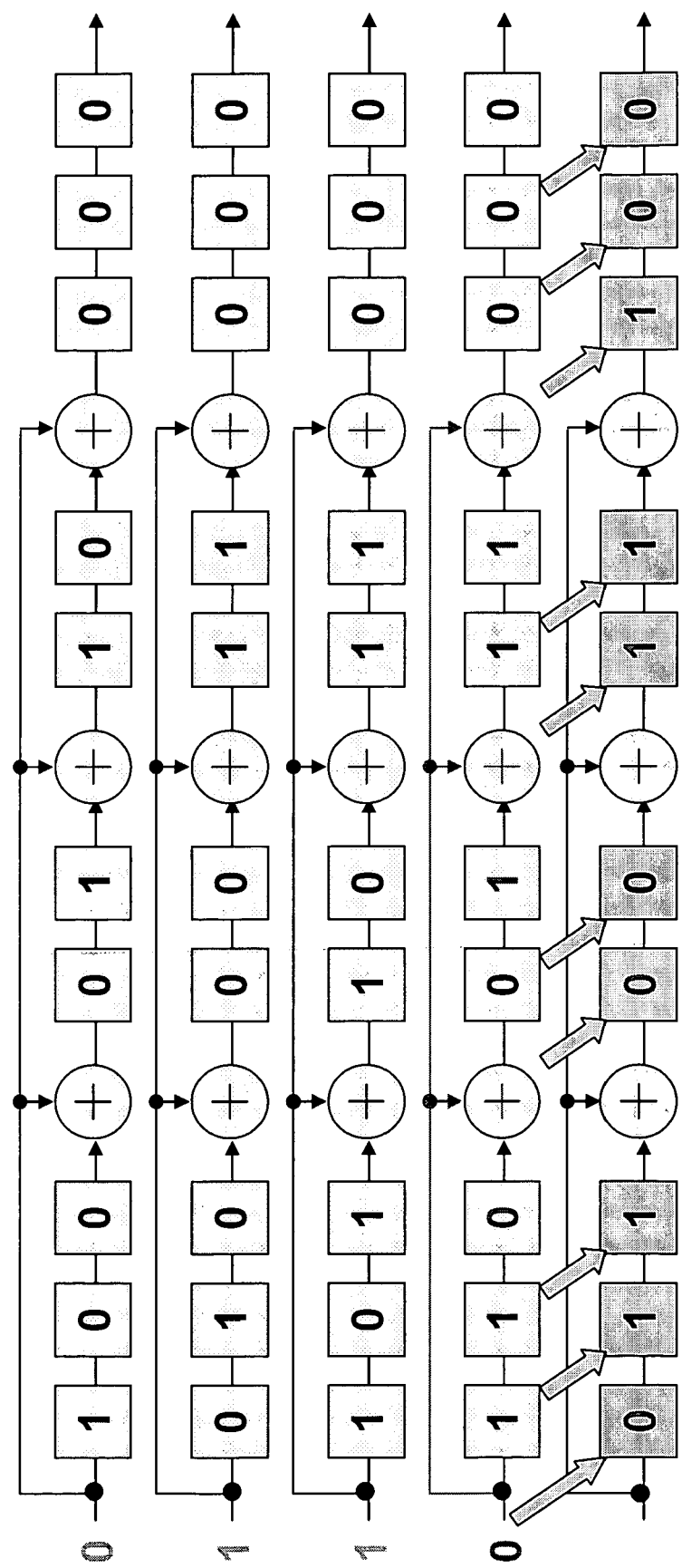
Figure 5F:
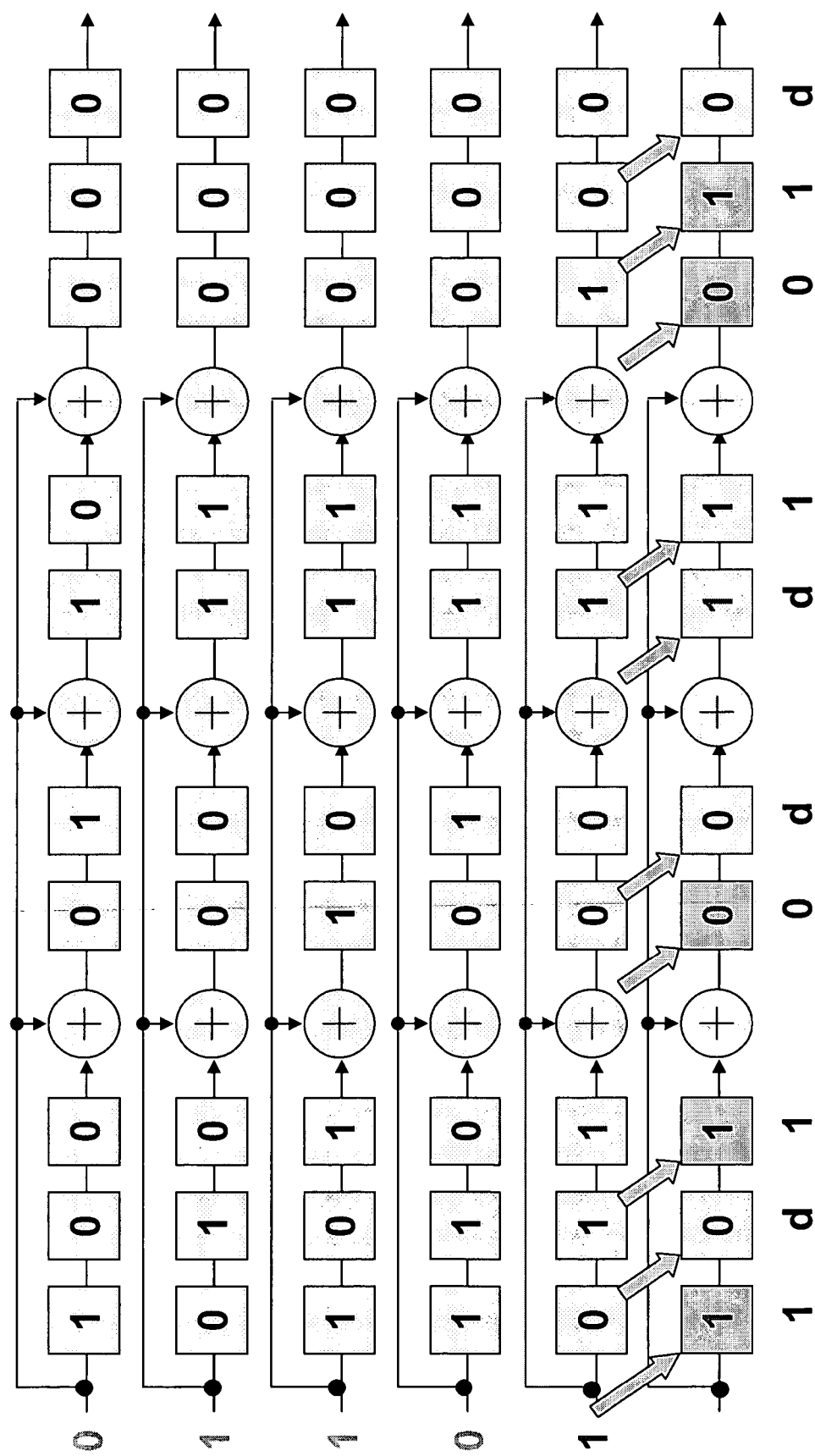

The present invention is aimed at determining the best supporting values for the non-Care_In bit positions so that the minimum number of scan cycles is sufficient to set all of the Care_In positions to their targeted values. FIG. 5a shows a 10-bit scan chain broken into 4 segments of 3, 2, 2, and 3 bits, respectively. As an example, assume that the initial state of the scan-chain is 100,01,10,000 and the target values are 1d1,0d,d1,01d, where "d" represents a don't care value for a non-Care_In bit position. The response of the scan-chain to the serial Scan_In sequence of 10110 is displayed in FIGS. 5b through 5f. It is seen that starting with the present state of 100,01,10,000, serial input sequence of 10110 brings the scan-chain to the final state of 101,00,11,010 which satisfies the requirement that the Care_In positions are set to their target values of 1d1,0d,d1,01d. In other words, given the 10-bit scan-chain with a starting state of 100,01,10,000 it takes only 5 scan cycles to set all of the Care_In bit positions to their target values. Since the total shift count is less than the length of the scan-chain this represents an accelerated scan operation whereby 5 scan cycles have been sufficient to achieve the results to be expected after 10 scan cycles using traditional scan. Therefore, the scan architecture described above has been termed accelerated scan.

Accelerated scan is based on the two separate techniques as described above; namely the technique for reducing Scan_Out cycles using a checksum or MISR and the technique for opportunistic scan that uses existing values in the scan-chain to load the Care_In values with new values. Using a MISR for reducing Scan_Out cycles has been suggested also by others in the literature, but identifying Care_Out bit positions, and performing Scan_Out operations to the extent that Care_Out bit values (i.e. not the entire scan-chain) have been observed is novel and is a key feature of the present invention. This way, the number of cycles needed for observing the test results are reduced from "L", where "L" is the total length of the scan-chain, to the minimum number of scan out operations necessary to capture only the Care_Out bit values, which is likely to be different for each different test vector. Opportunistic Scan is a novel technique that takes advantage of existing values in the scan-chain in order to set the Care_In values to pre-determined values using less than "L" cycles for the scan-in operations. Like traditional scan, accelerated scan uses overlapped scan-in and scan-out operations for consecutive test vectors by choosing the length of each scan cycle to be the longer of the scan-in and scan-out cycles that are being overlapped. This way, accelerated scan achieves loading the Care_In bits with their targeted values within the minimum number of shift cycles which is the lower of A—minimum number of shift cycles to scan out the contents of all Care_Out bits into a MISR (or checksum), and B—minimum number of shift cycles to set all of the Care_In bits with their desired values using opportunistic scan.

Accelerated scan is applied to each scan test vector individually and uses the present values in the scan-chain to load the Care_In bits with their target values. In a preferred embodiment, the present state of the scan-chain represents the test results captured by the application of the previous test vector. The present values in the entire scan-chain may be used to load the target values into the Care_In bits, but it is also necessary to scan out the present values of the Care_Out bits since only these bits carry useful information regarding the pass/fail status of the previous test that was applied. Test results can be captured into a MISR (or checksum), which has taps from multiple bit positions along the scan-chain. Typically, the tap positions are fixed (by the designer) but each result vector may have Care_Out bits in different positions along the scan-chain. The value of each Care_Out bit is captured in the MISR (or checksum) by shifting it into a bit position from which a tap is taken into the MISR (or checksum). Hence, all Care_Out bit positions are captured (i.e. observed) after at least "T" shift cycles where "T" is the maximum distance (in number of bit positions) from any Care_Out bit position to the first MISR (or checksum) tap position that is ahead of it (i.e. closer to the Scan_Out port). Thus, for each new previous-result/current-test scan vector pair there is a minimum number of shift cycles that is necessary in order to capture all Care_Out values from the previous-result vector. Therefore, it is possible to focus on using opportunistic scan to load the Care_In values, as described above, but the resulting Scan_In vector may need to be rejected and a longer one may need to be found if it is shorter than the minimum shift-count "T" that is necessary to read out all of the Care_Out values.

Formulation of the basic problem statement for using accelerated scan method is:

Given the starting state of the scan-chain and the positions and the desired values of the Care_In values, determine the shortest scan sequence in order to set the Care_In bits with pre-determined values such that the shift count is not less than the minimum number of Scan_Out cycles required to capture all of the Care_Out values in the MISR (or checksum).

This problem can be solved as follows:

The present state of the scan chain is given as: $S=S_n, \{S_{n-1}, S_{n-2}, S_{n-3}, \ldots S_0\}$ Where, $S_i=\{0, 1, U \text{ (unknown)}\}$ and $S_n$ represents the serial Scan_In value while $\{S_{n-1}, S_{n-2}, S_{n-3} \ldots S_0\}$ represents the present contents of the scan-chain.

Let $C=\{C_{n-1}, C_{n-2}, C_{n-3}, \ldots C_0\}$ be a set of constants, each corresponding to an element of S, such that $C_i=0$ if $S_{i+1}$ feeds data directly into $S_i$, and $C_i=1$, if $EXOR(S_n, S_{i-1})$ feeds data into Si. The next state, $S^+$, of the scan-chain can be expressed such that each bit of $S^+$ is of the form:

$$S_i^+ = EXOR(S_{i-1}, C_i \& S_n)$$

where "&" represents the logic AND function.

Using the above given formulation and the starting scan-chain values that are expressed as logic 0, 1 or U, symbolic simulation can be used to compute new values at each bit position after each shift cycle. Each Scan_In value is represented by a new symbol at the Scan_In port such that as new symbols become entered into the scan-chain through the Scan_In port, they affect values in some of the bit positions, either directly (as in bit position "n") or through an EXOR gate. The following table shows the values that would be computed using symbolic simulation for the output of each EXOR gate:

| $S_{i-1}$ | $S_n$ | $C_i$ | $S_i^+$ | $= EXOR(S_{i-1}, C_i \& S_n)$ |
|---|---|---|---|---|
| U | ? | 0 | U | regular shift with an unknown ("X") value |
| D | ? | 0 | D | regular shift with D value |
| ? | U | 1 | U | EXOR with an unknown input |
| U | ? | 1 | U | EXOR with an unknown input |
| D | 0 | 1 | D | regular EXOR operation |
| D | 1 | 1 | -D | regular EXOR operation |
| 0 | D | 1 | D | regular EXOR operation |
| 1 | D | 1 | -D | regular EXOR operation |
| $D_a$ | $D_b$ | 1 | $D_c$ | $D_c = D_a (+) D_b$ | where "U", D or $D_i$ (i=a, b, c, ...) represent any value or symbol except an unknown (U) value or symbol, and "-D" represents the inverse (i.e. NOT) of D. Symbol "(+)" is used to indicate the EXCLUSIVE-OR (i.e. EXOR) function. Furthermore, "?" represents any known value.

Using the above formulation, expressions for each bit position of the scan-chain can be expressed and evaluated after each shift cycle by performing symbolic computation. A valid solution is indicated if the resulting evaluation shows no conflicts of the scan-chain contents with the desired Care_In values. If the present shift cycle does not represent a valid solution then a new cycle of shift must be simulated and the evaluations are repeated. In addition, if a conflict-free solution is found but the number of shift cycles needed to reach that solution is less than the minimum number of shift cycles needed to capture all of the Care_Out values from the previous-result vector, then the solution is rejected and at least one more shift cycle is evaluated for a new solution. The property of completeness of accelerated scan assures that eventually a solution will be found and further that this solution will require at most as many shift cycles as there are individual bits along the scan chain.

Figure 6A:
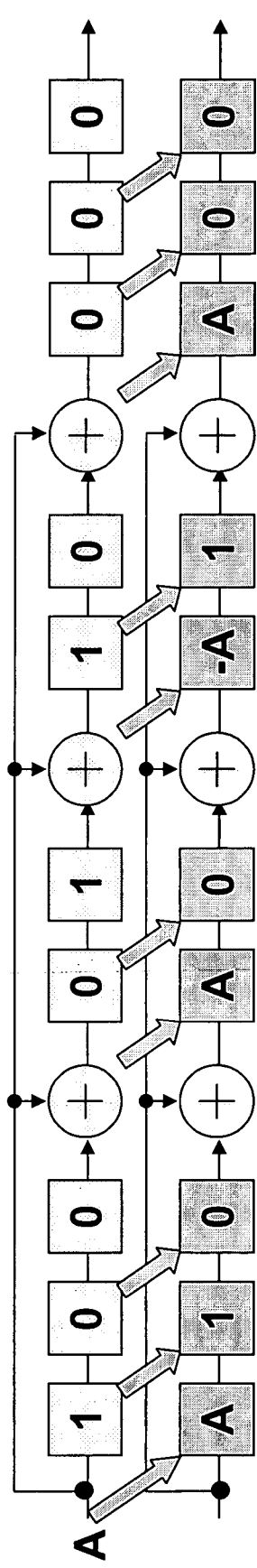
FIG. 6a shows the same example as used in FIG. 5a but uses symbolic values applied at the Scan_In port and shows the next state of the scan-chain after 1 shift cycle.
Figure 6B:
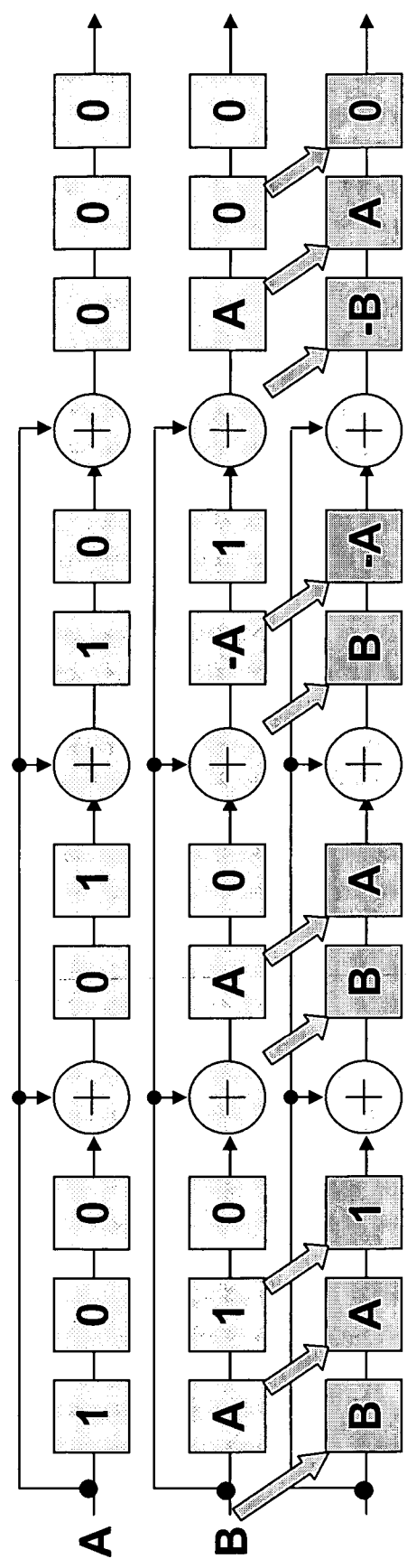
FIG. 6b shows the scan-chain state after 2 shift cycles.
Figure 6C:
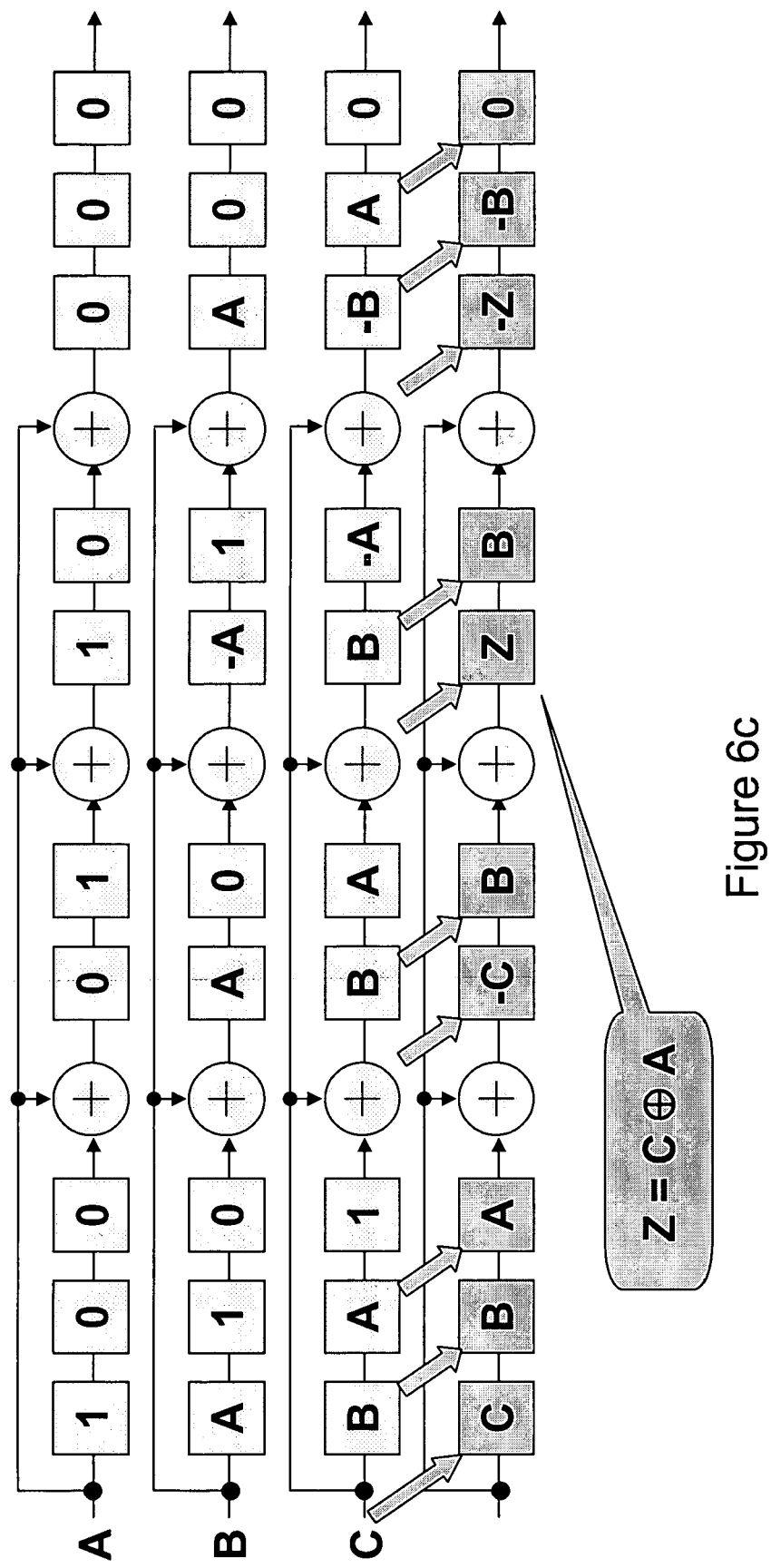
FIG. 6c shows the scan-chain state after 3 shift cycles and demonstrates how a new symbolic variable is introduced into the scan-chain while also generating and recording an EXOR equation that will have to be solved in order to find a valid solution.
Figure 6D:
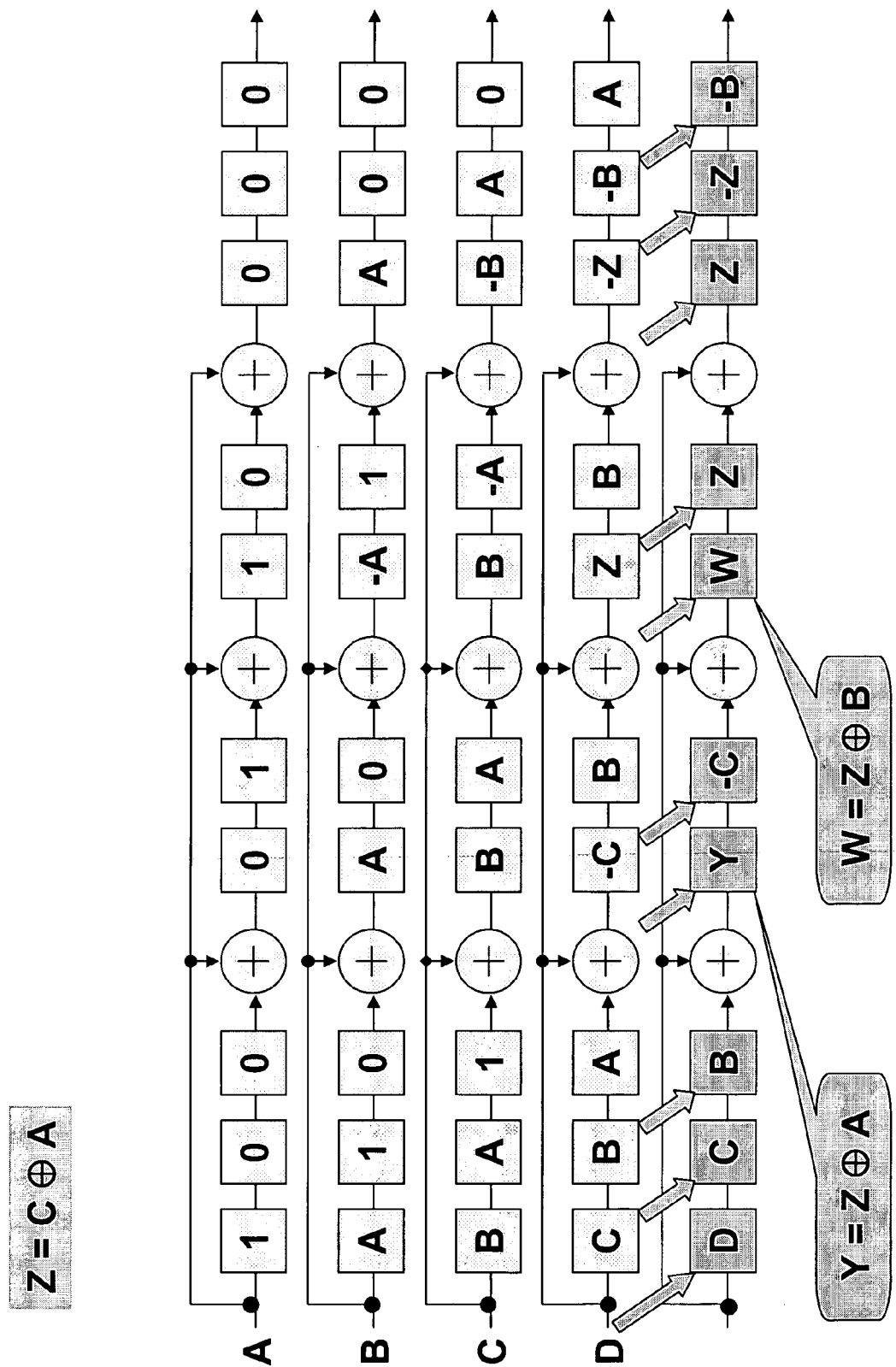
FIGS. 6d and 6e shows the scan-chain state after 4 shift cycles and 5 shift cycles, respectively, and shows the EXOR equations that have been generated.
Figure 6E:
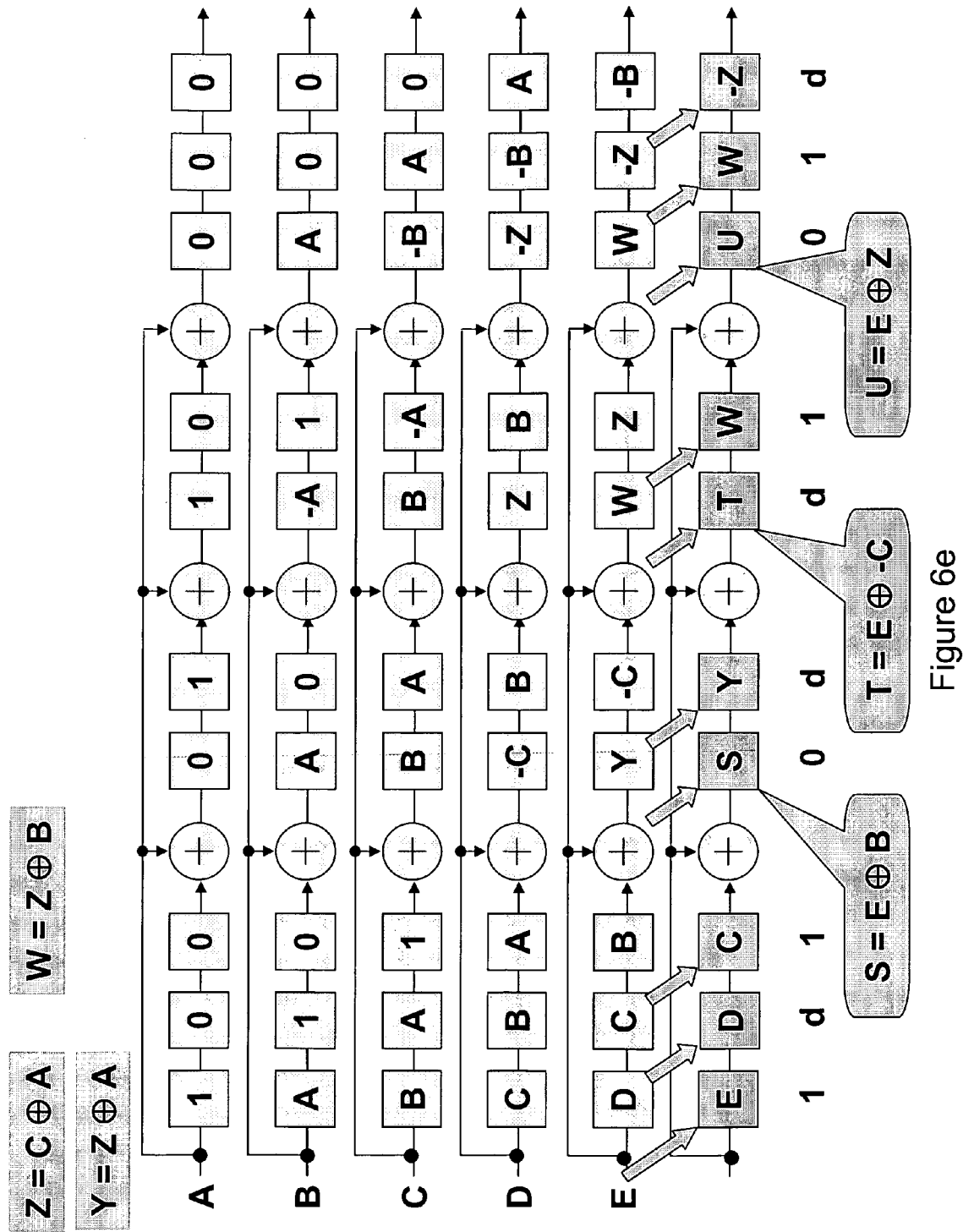

Applying this procedure to the example shown above produces the results shown in FIG. 6a through FIG. 6e. FIG. 6a shows the starting state of the scan-chain and shows its next state after 1 shift cycle while a symbolic value of "A" is applied at the Scan_In port. FIG. 6b through 6e show the state of the scan-chain after each shift cycle. FIG. 6c shows that at the $3^{rd}$ shift cycle it becomes necessary to enter a new variable, "Z" into the scan chain and record the relationship that "Z=C(+) A" as an EXOR equation that needs to be satisfied. After each shift cycle, it is checked to see if the symbolic values that are present in the scan-chain can be assigned to satisfy the Care_In values as well as allowing all of the EXOR equations to be solved without any conflicts. For the example, given the Care_In values of 1 d 1, 0 d, d, 1, 0 1 d, the first solution is found after the $5^{th}$ shift cycle by setting E=1, C=1, S=0, W=1, U=0, and using these values to solve for the remaining variables and EXOR equations as Z=1, Y=0, T=1, A=0, B=1, D=0, and E=1. Thus, Scan_In sequence, which is given by ABCDE=01101. This sets the final state of the scan-chain as 101, 00, 11, 010 that satisfies the requirement that the Care_In values should be set to 1d1,0d,d1,01d.

This example demonstrates that setting the symbolic values so that A=0, B=1, C=1, D=0, E=1 satisfies the conditions represented by the EXOR equations as well as achieving the desired values in the Care_In positions. Therefore, the 5-bit serial input sequence of E, D, C, B, A=1, 0, 1, 1, 0 (value for A is fed into the scan-chain first) achieves the Care_In values in the 10-bit long scan-chain.

A software program can be developed that implements the procedure described above for finding the shortest Scan_In sequence to set all Care_In values to the desired values. As the length of the scan chain grows and the scan chain is broken into more segments, very many symbolic variables must be tracked and very many EXOR equations must be solved. Furthermore, all of the work that has gone into finding a solution after a shift cycle goes to waste when it is discovered that a solution does not exist at that shift cycle and at least another cycle of operations must be performed. As a result, the above procedure grows increasingly slow as the shift count increases.

A preferred embodiment of the present invention offers a more efficient solution by formulating the problem in a different fashion. Considering the same example used in the previous state, it is known that the desired Care_In state is 1 d 1 , 0 d, d 1 , 0 1 d. It is possible to consider the immediately previous shift cycle and consider what the serial Scan_In value must have been so that the next state matches the desired Care_In state as shown. For most of the bit positions, the previous value can be computed by performing a shift operation in the reverse direction (i.e. going in the direction from the Scan_Out terminal towards the Scan_In terminal). FIG. 7 shows an example of executing the method of the present invention on the same example that was used earlier as depicted in FIG. 6.

Figure 7A:
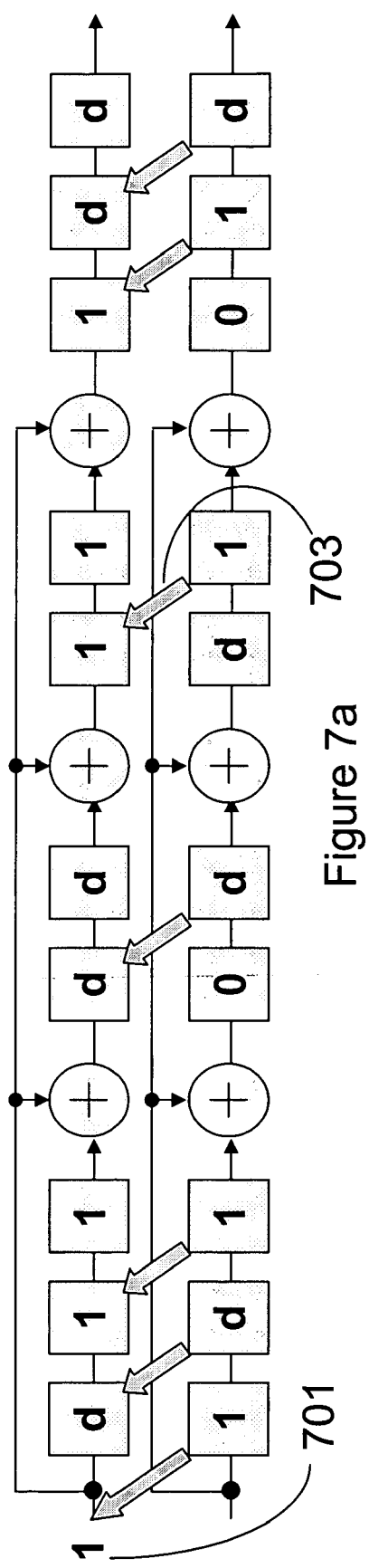
FIG. 7a shows what the previous state of the scan-chain should have been in order that one shift cycle later the desired present state of the scan-chain is obtained, which is the first step in the preferred and more efficient algorithm for computing the compressed sequence by starting from the desired scan-chain state and going backwards in time to compute the required previous state, until the computed previous state matches the known starting state of the scan-chain;.
Figure 7B:
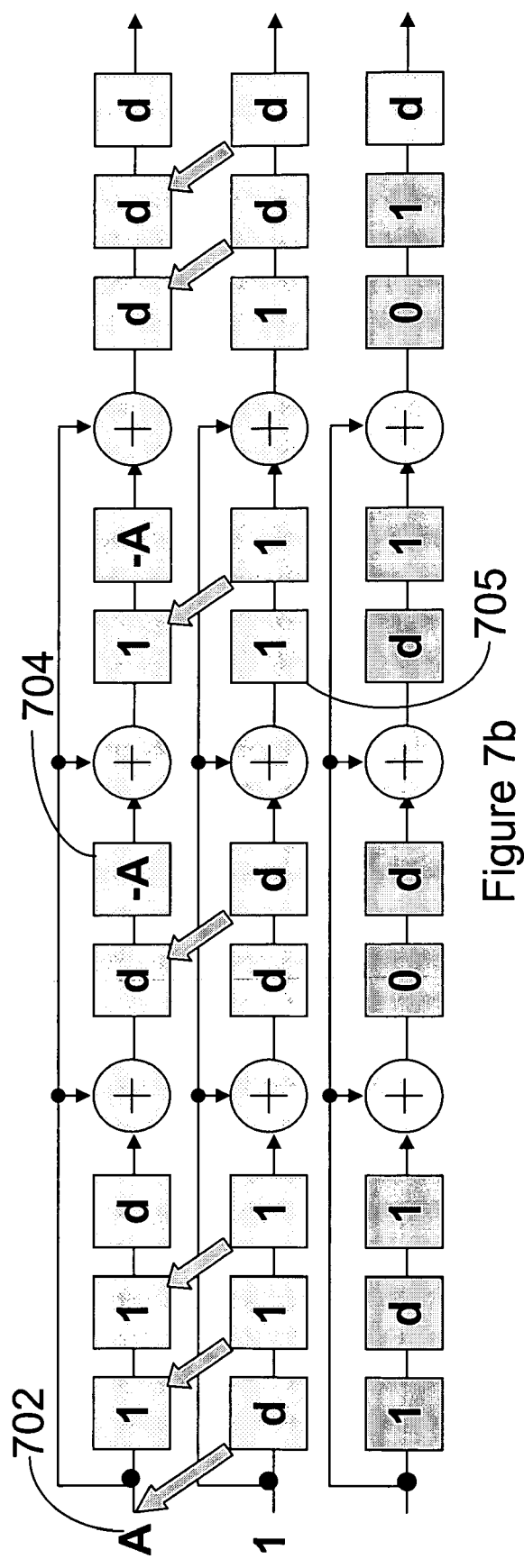
FIGS. 7b through 7e shows the computed previous scan-chain state for reverse-shift of cycles 2 through 5 of the preferred algorithm.

There are two special cases that need to be considered:

a.—A new variable must be introduced at the Scan_In terminal if the next value for the $1^{st}$ bit position along the scan-chain is a Don't_Care (i.e. "d"). This way the value at the Scan_In terminal is not committed prematurely until its effects on assigning different values to different bit positions have been evaluated. This is illustrated in FIGS. 7a through 7e. FIG. 7a shows that since the $1^{st}$ bit position of the scan-chain is required to be "1"701, the Scan_In at the previous cycle must have been set to "1". On the other hand, FIG. 7b shows that since the $1^{st}$ bit of the scan-chain is a don't care, the Scan_In value after the $2^{nd}$ reverse-shift cycle must be set to the symbolic value "A" (702) in order not commit it prematurely to a logic "1" or logic "0" value.

b.—The previous value of any bit position that feeds an EXOR gate must be assigned a value, say "V" so that the expression "Scan_In (+) V" results in the desired next-value for the bit position immediately following the EXOR gate. For example, FIG. 7a shows that after the $1^{st}$ reverse-shift cycle, the first bit position of the $3^{rd}$ segment in FIG. 7b (703) is required to be logic "1". Additionally, as described above, it has already been decided that the Scan_In value must be set to the symbolic value "A" after the $2^{nd}$ reverse-shift cycle. Therefore, the last-bit of the $2^{nd}$ segment 704 in FIG. 7b must be set to "−A" so that "A" (+) "−A"="1" (where, "−A" represents "not −A") can be achieved as the value in the $1^{st}$ bit position of segment 3 after 1 reverse-shift cycles.

Figure 7C:
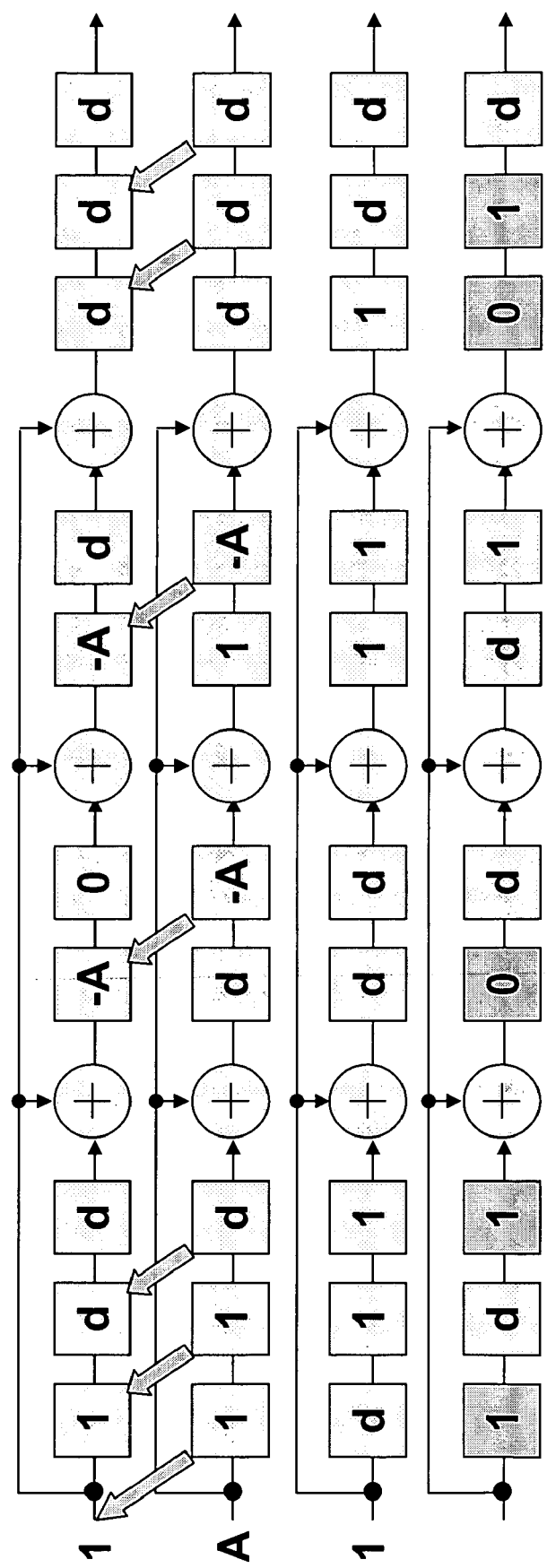
Figure 7D:
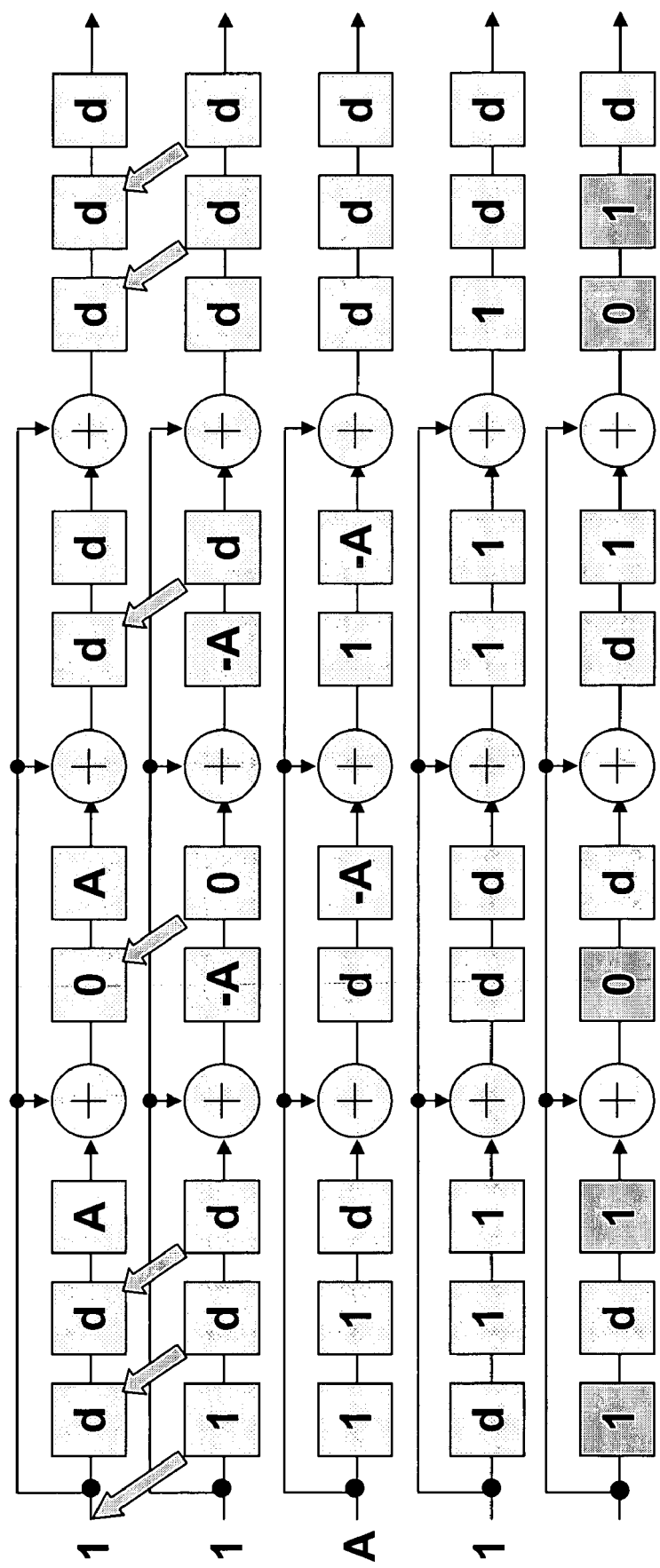
Figure 7E:
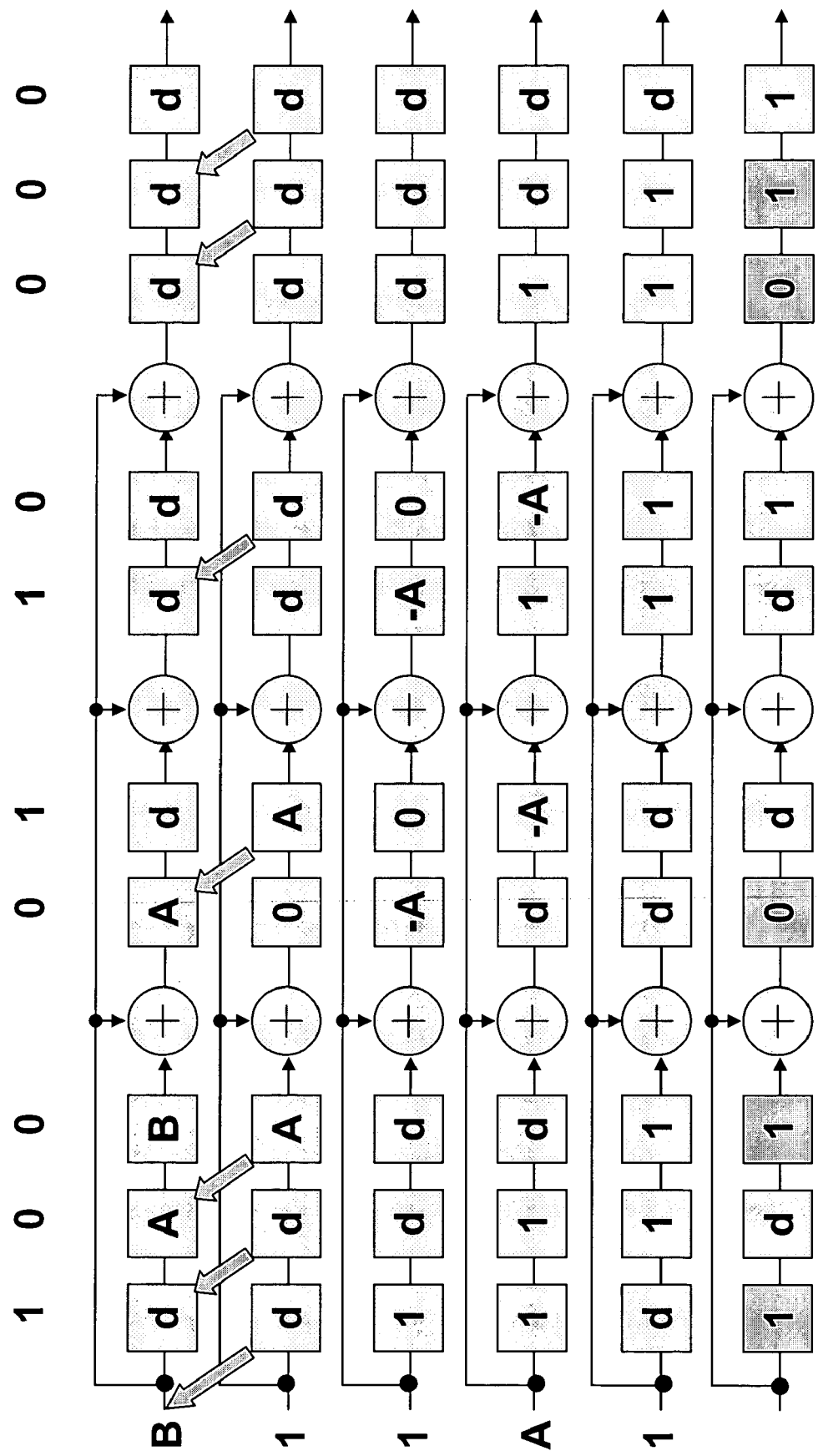

Continuing in this fashion, the previous state of the scan-chain can be computed as shown in FIGS. 7c through 7e. After each reverse-shift operation, it is necessary to check if the present state of the scan-chain which has jut been computed in order to determine if there are any bit positions which are in conflict with the known starting state of the scan-chain (e.g. 100, 01, 10, 000). The process is continued until a non-conflicting state is found. As shown in FIG. 7e, (i.e. 5 cycles before the final scan-chain state that satisfies to condition 1d1,0d,d1,01d), variables A=0 and B=0 can be set so that the state of the scan-chain, which is given by "dAB, Ad, dd, ddd" has no bits that are in conflict with the known starting state of the scan-chain (i.e. 100, 01, 10, 000). This shows that the 5-bit Scan_In sequence 01101 shall bring the scan-chain from its starting state of 100, 01, 10, 000 to a new state where all of the Care_In values have been set to their pre-determined values.

Figure 8:
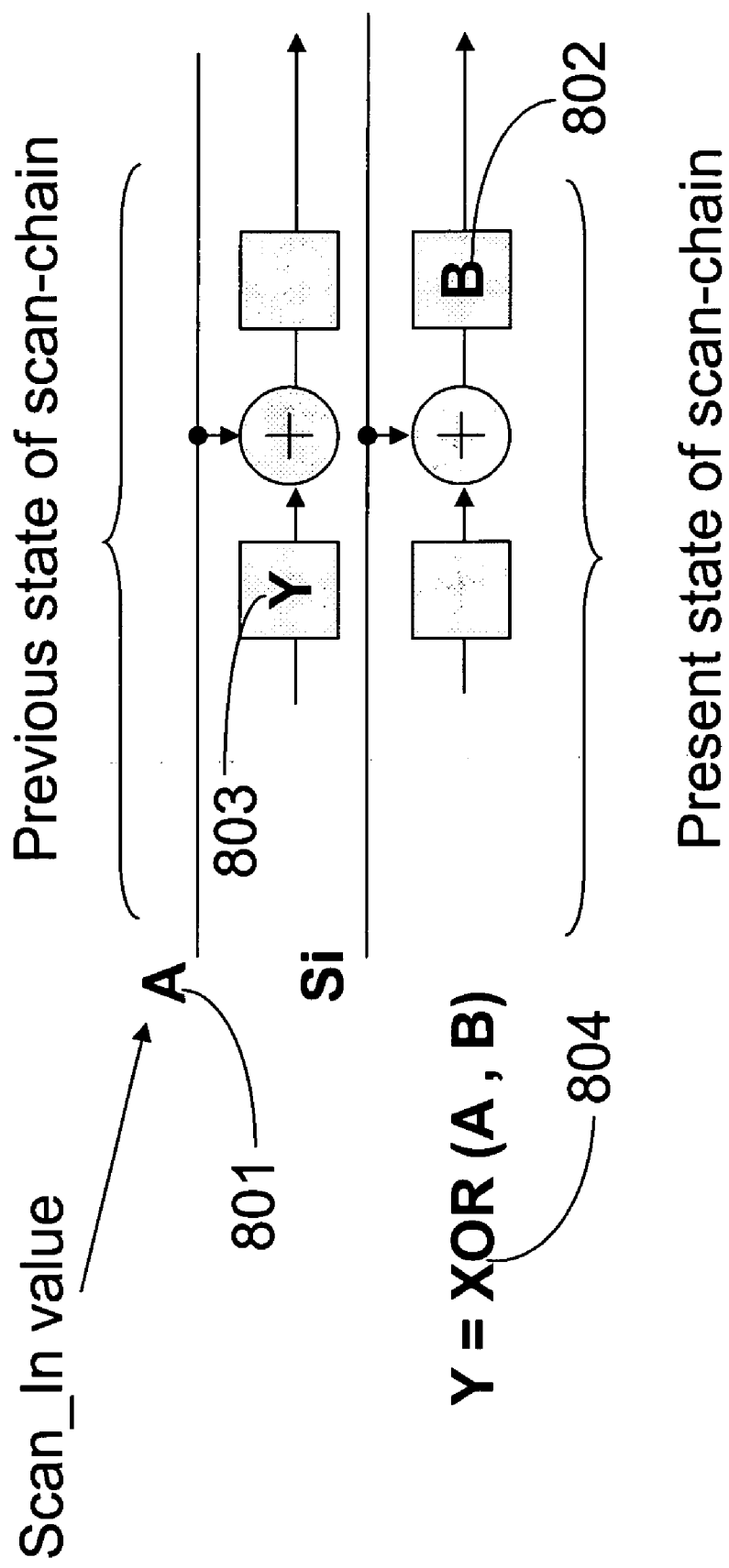
FIG. 8 shows an example of a situation where a new symbolic variable may be introduced into the scan-chain and an EXOR equation may be generated when using the reverse-shift algorithm.

The preferred embodiment, reverse-shift algorithm shown in example here achieves the same results as the first algorithm shown above but is more efficient. For the given example, it is seen that there were no EXOR equations that needed to be created and only two variables had to be created and set to specific values for the desired solution. However, this is not always the case. Whenever the EXOR gate feeds into a bit position whose present value is given by a symbolic variable and the previous Scan_In value has already been assigned a different symbolic variable that represents its value, yet another symbolic variable needs to be introduced to represent the previous value of the bit position feeding that EXOR gate. Furthermore, an EXOR equation needs to be created to capture the required relationship among the variables. This is illustrated in FIG. 8. As shown in FIG. 8, when the Scan_In value is represented by a symbolic variable, say "A" (801) and the first bit position of any segment is represented by a different symbolic variable, say "B" (802), the previous state of the last bit of the previous segment is expressed using a new variable, say "Y (803) and an EXOR equation is recorder that shows the relationship Y=A (+) B (804). For a solution to be valid, all variables that are present in the computed previous state of the scan-chain should be assigned logic values under which the scan-chain state does not have any conflicts with the known starting state, plus all of the EXOR equations should be simultaneously solvable.

The reverse-shift algorithm derives its efficiency from its characteristic that traversing each EXOR gate is done in a way that computes and from then on maintains the required relationship among the inputs to the EXOR gate. For example, if the Scan_In value is a "1" and the present state of the next bit position is, say "V", it is clear that the previous value in the bit position that feeds the other input to the EXOR gate must have been "−V" so that the relationship "V"=EXOR ("1", "−V") can be satisfied. Once formed, (i.e. once the EXOR equation has been evaluated) this relationship is represented simply by the value of "−V" in the bit position and no new EXOR equation needs to be created. As the above example illustrates, there are fewer EXOR equations that are generated that need to be solved simultaneously, thereby improving the efficiency of the algorithm.

Efficiency of the improved algorithm of the invention described here is, in part, due its working in the reverse direction. First, the set of conditions (i.e. Care_In values) that need to be satisfied is taken as the end point and the necessary conditions that must have been met in the previous cycle are determined. In general, the conditions for the previous cycle are derived from the conditions for the end cycle by performing one bit of shift in the reverse direction. In addition, it is necessary to evaluate EXOR functions to compute the previous bit value of a scan-chain position that feeds an EXOR gate, which couples two segments together. This computation is done symbolically and in many cases may result in a constant value (0 or 1) or a single variable (e.g. Z or −Z), which is entered into the previous bit position. At times, when the evaluation of the EXOR function can not be reduced to a single constant or variable, a new variable is introduced so that the new variable is entered into the previous bit position while also adding an EXOR equation to an ongoing list of such equations, as illustrated in FIG. 8. Thus, after each reverse-shift cycle, the state of the scan-chain contains values or expressions that carry backward the necessary conditions for the final state to contain values that satisfy all of the desired Care_In values. The efficiency of the process is demonstrated each time one of the symbolic EXOR evaluations results in a constant value (0 or 1) or variable (Z or −Z) that does not require a new EXOR equation to be added to the list. In other words, the solution to the desired end-state of the scan-chain state becomes embedded in the symbolic expressions for each of the previous scan-chain states that have been computed. Furthermore, the effectiveness of the method of the present invention increases with decreasing length of the shortest Scan_In sequence that represents a valid solution. Thus, better solutions can be found faster while finding solutions not as good takes longer.

For a given length of a scan-chain, the number of individual segments and the size of the segments may have a significant impact on the effectiveness of data compression as well as affecting the performance (i.e. efficiency) of the method that is used in determining the minimum-length solution. The total number and positions of the output taps also affect the final solution but not as much as the positions of the EXOR gates between the segments. The following recommendations are presented as a general guide. Other strategies may also be used:

a.—Increasing the number of segments helps find a better solution. However, when number of segments becomes too large, this may create too many EXOR equations to be resolved and may slow down the algorithm for finding a valid solution. Additionally, increasing the number of EXOR gates (i.e. increasing the number of segments) beyond some value may actually produce worse results by making it more difficult to find a conflict-free solution for all of the EXOR equations that have been generated at each reverse-shift cycle.

b.—For a given number of segments, it is better to choose the length of the subsequent segments to be different from that of the previous segment. Furthermore, it is better to have shorter length segments in the beginning (i.e. closer to the Scan_In port). A preferred solution is to use geometric progression for increasing the length of each subsequent segment such that the ratio of the length of the last segment over the length of the first segment is a small number (e.g. between 2 and 10). For example, given individual segment lengths $L_1$, $L_2$, $L_3$, etc. choose K such that 2<K<10, and furthermore that $$L_2/L_1 * L_3/L_2 * L_4/L_3 * \ldots * L_n/L_{n-1} = K, \text{ where}$$
$$L_i/L_{i-1} = L_{i+1}/L_i.$$

c.—Choose the number of output taps so that they are evenly positioned and the distance between two consecutive taps is less than the average length of any segment. This helps assure that all Care_Out values will have been observed (i.e. captured in checksum or MISR) at least on one output tap location by the time the Care_In positions for the next test pattern have become set to their target values.

At times, some of the bits in the scan-chain may have unknown values. For example, this may happen if the response of the target IC to a test vector may depend on races among signal values such that the outcome may be different under different temperature or voltage conditions. A typical example may be of a case where the data input and the clock to a flip-flop change from "0" to "1" at the same time such as may occur during powering up the circuit. In this case the value expected in the flip-flop after the clock change would be designated as an "X" (i.e. unknown) since neither a "0" nor a "1" value can be assured. Such values are termed "Care_X" values. If the full length (L) of the scan-chain is to be shifted, as in traditional scan, the "X" values become purged and all bits can be set to "0" or "1", as desired, in a deterministic manner. Present invention takes advantage of the present values in the scan chain in setting the next state of the scan-chain. Since less than "L" shift cycles may be used, the purging of all "X" values from the scan-chain may not be possible. It is therefore necessary to handle the "X" values (that is, the Care_X values) carefully so that all Care_In bits can still be set to their pre-determined values of "0" or "1" without depending on the values at the Care_X positions. This can be achieved in a straightforward manner by using a unique symbol, "X" to represent the value of a bit position as an unknown. The "X" value is used in a similar way as the "D" value in evaluating the EXOR equations so that whenever any input of the EXOR is set to "D" or "X", the output value is set to "D" or "X", respectively. In other words, If, $A=B(+)"D"$, then $A="D"$,      1)

If, $A=B(+)"X"$, then $A="X"$.      2)

Furthermore, when comparing the computed previous state of the scan-chain to the given, known starting state, a conflict should be declared if any bit position contains either a "0" or "1" value in one register and contains an "X" value in the other register. This way, "X" values are allowed to be present in the scan-chain but are prevented from interfering with the values set in the Care_In positions or the known starting state of the scan-chain. This way, the methodology of the present invention allows dealing with "X" values in the scan-chain without affecting the validity of the produced shortest-sequence Scan_In stream.

The presence of "X" values in the scan-chain may also cause problems in observing the results from the previous test pattern. As the previous result values pass under the tap positions that feed the checksum or MISR register, any "X" values shall corrupt the observed value. In actuality, each bit position will either have a "0" or "1" value in it despite the presence of an "X" value in the model that is used by the algorithm. However, under different operating conditions (such as temperature or voltage) a given IC may produce different results in the Care_X positions in an unpredictable manner. Therefore, it is necessary to block (i.e. mask) the "X" values before they can affect the checksum or MISR register. One way to deal with this situation is to modify the target design so that test patterns do not produce "X" (i.e. "unknown") values in any scan bit position. Alternately, test patterns that contain any "X" value in them may be rejected and traditional scan or non-scan techniques can be utilized to go after faults that may remain undetected as a result of eliminating such patterns. Yet another solution is to use external input and additional circuitry inside the target IC to mask off the "X" values before they can enter the checksum or MISR register.

Figure 16A:
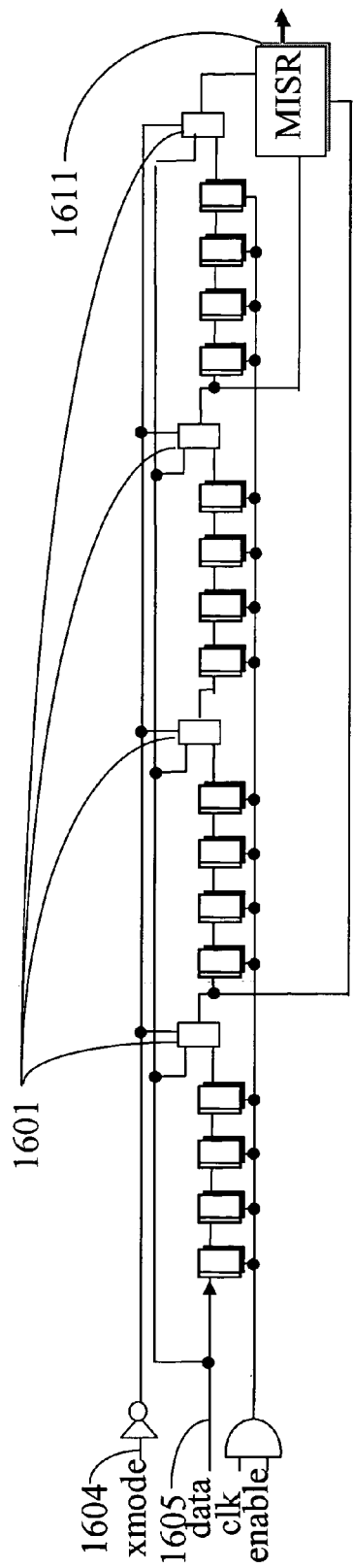
FIG. 16a shows an embodiment that uses blocking circuits to prevent unknown ("X") values from spreading into a MISR and to purge them out of the existing scan-chain.
Figure 16B:
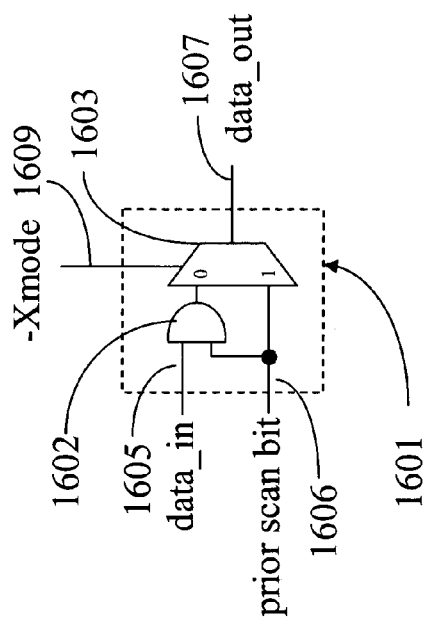

FIG. 16a shows a preferred embodiment of a scan-chain structure to block the propagation of "X" values into a MISR and also to purge them out of the scan-chain. This is achieved by using blocking circuits 1601. FIG. 16b shows the details of the blocking circuit 1601. The circuit works as follows:

When Xmode 1604 signal is set to logic 0, the MISR is enabled to work responsive to values received from the scan-chain and merge the captured values into an overall signature value. Also, when Xmode 1604 is set to logic 0, this enables the blocking-circuit multiplexor 1603 to pass the prior scan bit value 1606 to its output port 1607 so that it can be received by the next flip-flop in the scan-chain. Hence, setting Xmode=0 corresponds to the normal mode of operation of the scan-chain where no X-blocking occurs. Setting Xmode=1 results in the Xmode port 1609 being set to 0 which enables the blocking-circuit multiplexor 1603 to either pass a logic 0 or the data on its data-in port 1605 to its output port 1607. This way, Xmode 1604 can be used together with the data-in 1605 to either pass the previous scan bit value 1606 or a logic 0 value as input to the next flip-flop on the scan-chain. Thus, whenever a previous bit value 1606 is known to be in an "X" state, control signal Xmode 1604 can be set to logic 1 and the serial scan-in signal which is connected to serial scan-input port of the scan-chain and is also connected to the data-in port 1605 of the blocking-circuits 1601 can be used either to advance the state of the scan-chain in normal fashion or to advance the scan-chain state by replacing each "X" bit value at each bit position immediately prior to each blocking-circuit 1601 with a logic 0 value. In this fashion, the number of blocking-circuits 1601 can be independent of the number of taps to the MISR 1611, and blocking "X" states from the MISR 1611 can be independent of clearing "X" states from the scan chains. Since the number and bit positions of the "X" bits are known to the ATPG program, it is possible to determine the number of cycles for setting Xmode=1 as well as the precise shift cycle counts for setting data-in 1605 to a logic 0 or logic 1 value before reverting back to a normal mode (with Xmode=0) to continue using the scan-chains to test the target integrated circuit. Furthermore, since the ATPG program also produces a fault dictionary for the Care_Out values, it is possible to optimize the number of additional shift cycles to eliminate the "X" states, while minimizing the undetected faults due to simultaneously clearing "X" states and Care_Out values from the scan string, before the Care_Out values were captured. In addition, optimizing of the number and placement of the blocking-circuits, following the predefined tap points, based on the results of the ATPG program can be done to further minimize the number of clock cycles needed to both eliminate the "X" states while capturing the necessary Care_Out states in the MISR.

Figure 9:
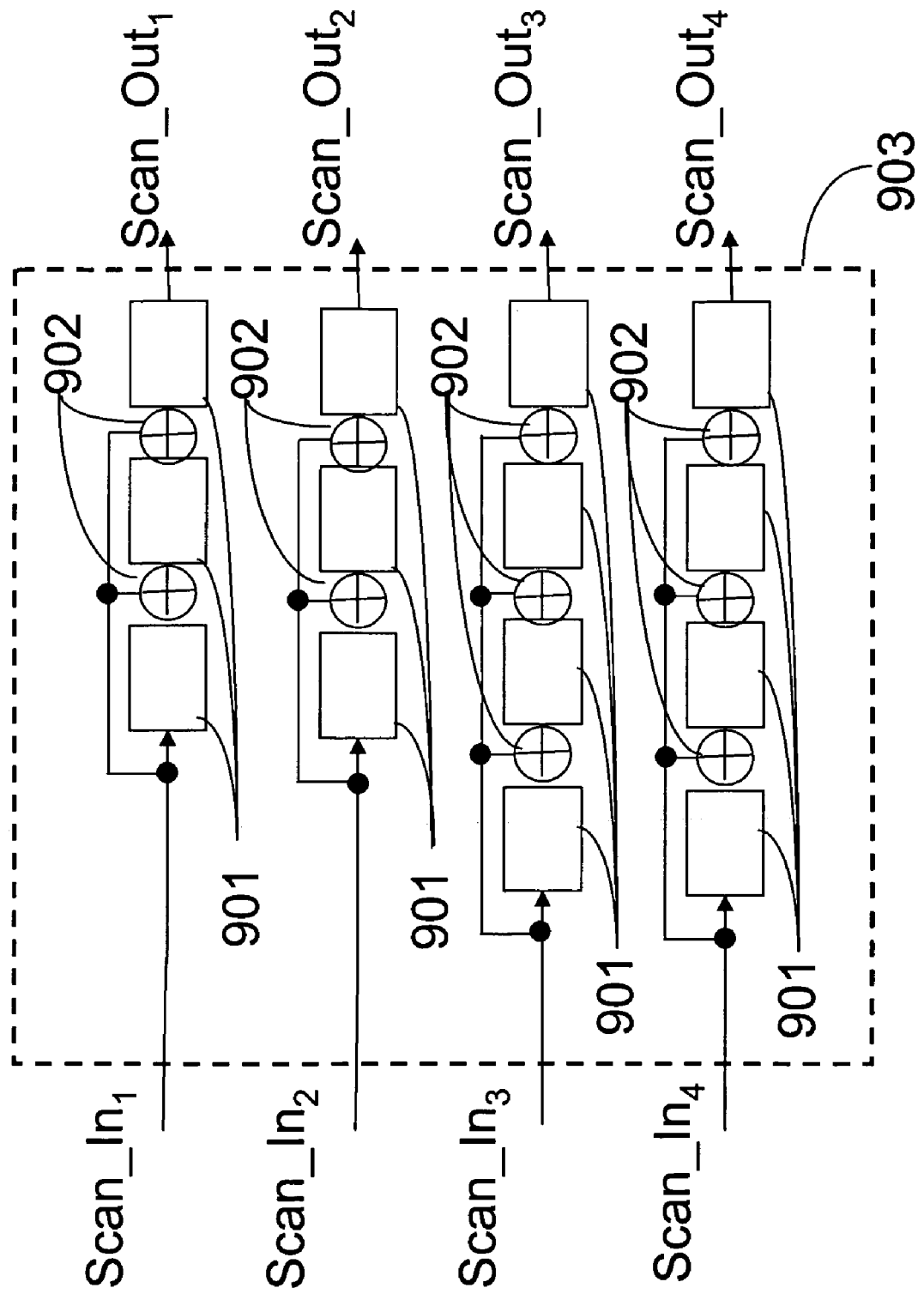
FIG. 9 shows an example of using present invention with multiple, parallel scan-chains each of which may have multiple scan segments of differing lengths.

In another preferred embodiment, the methodology of the present invention is applied to multiple/parallel scan chains, as illustrated in FIG. 9. It is not necessary for the individual/parallel scan chains to be of equal length or even have the same number of scan-chain segments or scan-chain segment lengths. For example, FIG. 9 illustrates an IC with 4 scan chains that can be operated in parallel using 4 pairs of Scan_In/Scan_Out pairs of pins. In between each Scan_In/Scan_Out pair, each scan-chain can be structured to contain any number of scan segments 901 of varying lengths, separated by EXOR gates 902. Compressed test patterns can be developed individually for each scan-chain using the methodology of the present invention, by using the reverse-shift algorithm.

If the targeted (desired) patterns and the individual scan-chain properties are different, this may lead to compressed test patterns that are not of equal length. Properties of the individual scan-chains that may affect the length of the compressed test pattern include:

a.—Overall scan-chain length,
b.—Number of segments,
c.—Length of each segment,
d.—Logic function that is used to couple the segments together (e.g. EXOR gates),
e.—Number and position of bits from previous segment (or segments) and Scan_In that are used in the logic function to couple the segments,
f.—Number and position of tap points for capturing Care_Out values in checksum ort MISR register.
g.—Additionally, values and positions of target Care_In, Care_Out values and Care_X positions may affect the length of the compressed scan-chain sequences. Therefore, it can be expected that different scan-chains will require compressed scan patterns of different lengths.

If, parallel scan is implemented to operate all scan-chains simultaneously, it is necessary to make sure that the Scan_In sequences applied to each scan-chain are equal in length. This may require rejecting a shorter length of compressed test pattern that has been computed for a scan-chain and look for a longer sequence that matches the length of compressed test pattern for all scan-chains. For example, assume that for the example shown in FIG. 9 and for a particular target test pattern, the following lengths of compressed patterns have been computed for the individual scan-chains:

Chain-1: 121, 133, 333, 527, 765
Chain-2: 99, 133, 333, 455, 527, 700
Chain-3: 111, 121, 131, 133, 333, 527, 900
Chain-4: 125, 333, 527, 655, 821

For each scan-chain, the last number that is shown indicates the full-length of that scan-chain. The property of completeness of accelerated scan assures that a solution exists at the full-length of the scan-chain. In this example, the lowest common matching length for all 4 scan-chains is 333, and for each scan-chain, the compressed test pattern that has length=333 shall be used so that all scan-chains can operate simultaneously (i.e. in parallel) and all 4 chains can be loaded within 333 cycles. Compared to using traditional parallel scan approach, the overall data compression and time compression factors can be computed as follows:

Overall Time_Compression=900/333=2.70

Scan_In Data_Compression=(4×900)/(4×333)=2.70

As the above example illustrates, the requirement to operate all scan-chains simultaneously may reduce compression effectiveness. Calculating data compression individually for each scan-chain indicates that if minimum-length compressed test patterns are used, the total volume of compressed test vectors is given by:

Scan_In Minimum_Data length=121+99+111+ 125=456

Data_Compression=(4×900)/456=7.89.

When considering reduction of data volume due to also reducing the total number of in the Scan_Out streams, it is clear that data compression as made possible by using the present invention offers great advantage. Furthermore, if a MISR is used to observe and compress the Care_Out values, the overall data compression becomes effectively doubled.

As the above example illustrates, operating multiple scan-chains simultaneously may reduce the effectiveness of data compression. This can be prevented by operating each scan-chain for only the number of cycles necessary to Scan_In/Scan_Out its minimum-length compressed-test patterns/results. There are several ways that this may be achieved:

1—In one embodiment, each scan-chain is provided with a separate scan clock so it may be operated for the number of Scan_In/Scan_Out cycles necessary for that scan-chain, independent of the other scan-chains. This way, each scan-chain can be supplied its individual minimum-length compressed Scan_In sequence. Multiple scan-chains should be controlled so that scan-chains requiring longer Scan_In/Scan_Out sequence are started before others. This allows completing Scan_In/Scan_Out on all scan-chains simultaneously so that system clock(s) can be applied to all scan-chains simultaneously in order to capture the DUTs response to the test pattern.

2—In another embodiment, a separate ENABLE control signal is provided for each scan-chain so that all scan-chains may receive the same (common) scan clock(s) while only those scan-chains whose ENABLE signals have been asserted allow the scan-chain to advance. As in the previous case, the individual enable signals should be asserted or de-asserted so that scan-chains requiring longer Scan_In/Scan_Out sequence are started before others. It is still advantageous to control the scan-chains so that they all complete their respective Scan_In/Scan Out operations simultaneously.

3—In yet another embodiment, the scan clocks to the individual scan-chains are controlled so that only one chain is operated at a time. Furthermore, a single (common) Scan_In/Scan_Out signal pair is used to feed data to and return data from all scan-chains so that only the currently enabled scan-chain's data is presented on the Scan_Out port.

Figure 10A:
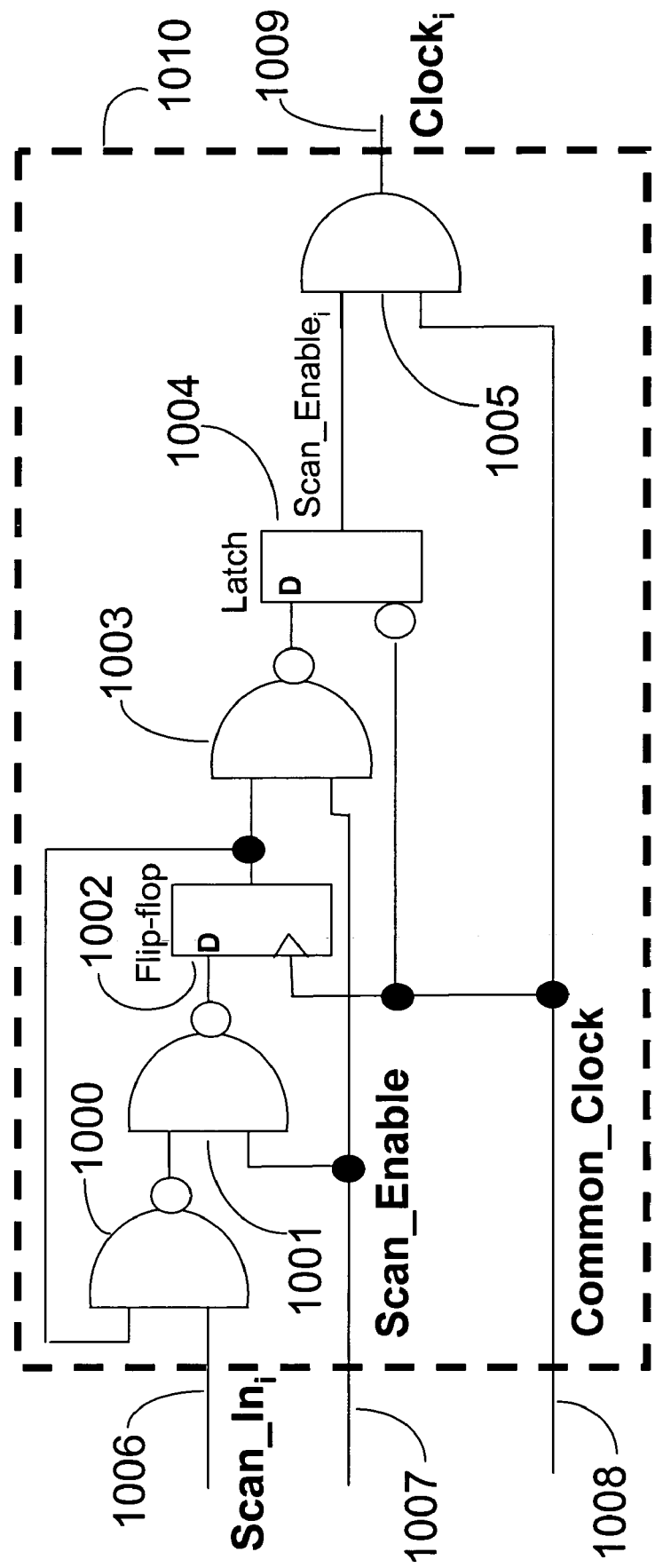
FIG. 10a shows an embodiment of a logic circuit, as described in the previous U.S. patent application Ser. No. 10/351,276, filed Jan. 24, 2003, that can be used to start and stop the scan-clock for a scan-chain using the values that are applied to the Scan_In port of that scan-chain.
Figure 10B:
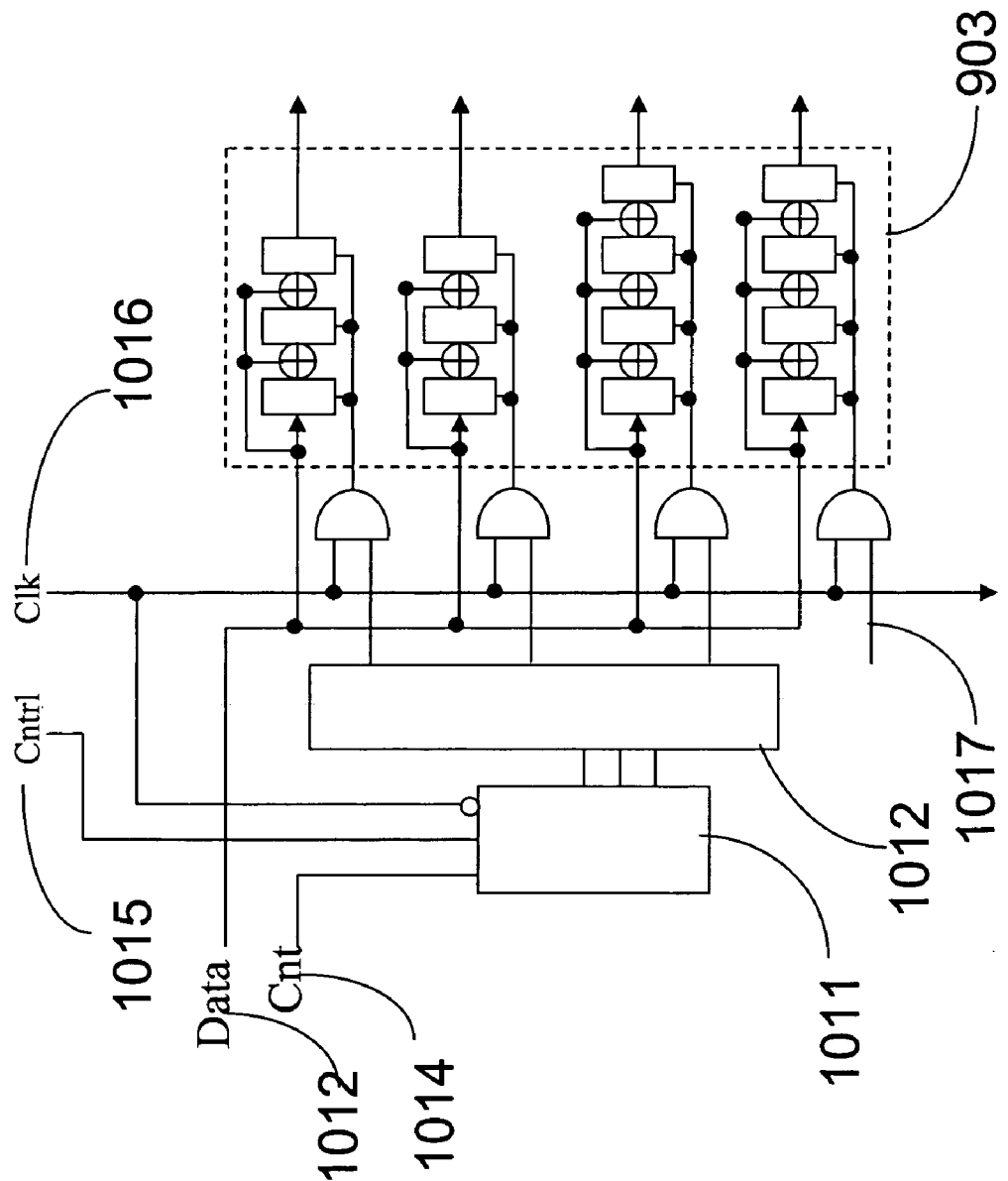
FIG. 10b shows an improvement over the circuit of FIG. 10a, with serialization of compressed scan-in data.

4—As defined in U.S. patent application Ser. No. 10/351, 276 a separate ENABLE control signal for each scan-chain is provided where the ENABLE signal is carried as part of the Scan_In sequence for each scan-chain. This can be achieved by adopting a protocol that uses the incoming Scan_In values to represent the ENABLE signal value until the ENABLE becomes asserted and the remaining Scan_In values are used to represent the Scan_In values for the compressed test pattern. After each test vector is loaded into the target IC, the target IC is taken out of the scan mode and placed in the "capture" mode so that it responds to the present test pattern. Re-entering into the scan mode can be used to turn-off (i.e. disable) the ENABLE circuits of all scan-chains so that they remain turned-off until they become turned-on again by a specific value (or sequence of values) applied at the Scan_In port for that scan-chain. For example, "Scan_In=1" may be chosen to turn-on the ENABLE circuits after they become turned-off. This way, any scan-chain that requires remaining turned-off would be provided with a Scan_In sequence that contains Scan_In=0 values in its initial bits, until it is desired to turn-on that scan-chain. At that time, the Scan_In value would be set to Scan_In=1 so that subsequent values on the Scan_In port can be interpreted as serial data for the scan-chain. FIG. 10 illustrates a design for a sample ENABLE circuit that works in this fashion. The elegance and simplicity of this solution may indicate that it is a preferred solution in many cases. The circuit described in FIG. 10a receives the Scan_In signal 1006 as an input and uses its value to determine if clocking of the i-th scan-chain should be turned-on. When the Scan_Enable signal 1007 is de-asserted (logic 0) this causes the output of NAND-gate 1003 to become set at logic 1 and causes latch 1004 to become logic 1 when Common_Clock signal 1008 becomes logic 0. Output of latch 1004 is labeled as Scan_Enable$_i$, which is used to gate the Common_Clock signal 1008 using AND-gate 1005. Output of AND-gate 1005 is labeled Clock$_i$ 1009 and can be used to clock the flip-flops and scan-chain$_i$. Setting Scan_Enable 1007 to logic 0 also causes output of NAND-gate 1001 to become logic 1 so that flip-flop 1002 becomes set to logic 1 with the first subsequent rising-edge of Common_Clock 1008. When Scan_Enable 1007 is first set to logic 1 in order to enter the scan mode, this causes output of latch 1004 to become logic 0 which blocks clock pulses from passing through AND-gate 1005. Output of latch 1004 remains at logic 0 until flip-flop 1002 becomes reset. To reset flip-flop 1002 requires Scan_In$_i$ 1006 to be set to logic 1 while Scan_Enable 1007 remains at logic 1. In other words, flip-flop 102 remains set during each Common_Clock 1008 cycle until Scan_In$_i$ 1006 becomes set to logic 0. This way, clock$_i$ 1009 remains blocked for all clock cycles until after the first cycle when Scan_In$_i$ 1006 is set to logic 0. Once reset, flip-flop 1002 remains in the reset state as long as Scan_In$_i$ 1006 remains at logic 1. Hence, once the first logic 0 value on Scan_In$_i$ 1006 has been used to enable clock$_i$ 1009 subsequent values of Scan_In$_i$ 1006 do not affect clocks 1009 so that Scan_In$_i$ 1006 can be used to as may be required to provide serial input to scan-chain-i. The gating circuit becomes enabled again when Scan_Enable 1007 is set to logic 0 and Common_Clock 1008 is set to logic 0 in order to allow the scan-chain flip-flops to respond to their system data inputs instead of performing another shift operation when the next rising-edge of Common_Clock 1008 is applied. This way, the response of the circuit under test to the scan-in vector that has just finished loading can be captured into the scan-chain flip-flops while simultaneously causing output of latch 1004 to become set to logic 1 so that gating of clocks 1009 signal can be controlled as may be needed for the next scan-in test vector, using Scan_In$_i$ 1006).

Using any of the solutions described above allows each scan-chain to be operated so that each scan-chain can be loaded with its minimal-length compressed Scan_In sequence. Scan-chains that have longer compressed Scan_In sequence are padded with Scan_In values (e.g. set to logic 1 when using the circuit shown in FIG. 10$a$) that are used to keep their ENABLE circuits to remain in their turned-off state until it is okay to enable the scan-chain. This means that each scan-chain is fed with the same length Scan_In sequence that contains at least one additional bit to turn-on the ENABLE circuit for that scan-chain. Using the same example as before, this leads to an overall Scan_In data compression of:

$$Data\_Compression=(4\times 900)/(4\times(125+1))=7.14$$

This compares favorably to the previously computed compression factor of 2.70 that requires keeping the multiple scan-chains active and operating them simultaneously.

Another embodiment, shown in FIG. 10$b$, uses a single data input 1012, and serializes the compressed data for each scan chain, by selectively scanning in each of the scan chains. The example circuit shown in FIG. 10$b$ controls the scan actions of four scan strings 903 of different scan segment counts such as shown in FIG. 9. The control signal 1015 enables all the scan chain clocks, which are derived from a common clock 1016 by turning on all the outputs from the Decode 1012. When the control signal 1015 is turned off it resets the counter 1011 to enable the clock for the first scan chain by turning on the first enable signal 1017 out of the decode 1012. After the compressed scan sequence has been applied to the first scan chain, the Cnt signal 1014 is set for one clock cycle, and the counter 1011 counts up, thus enabling the next scan chain's clock through the decode 1012. This process continues until all the compressed data has been transferred into the strings. While this technique does not reduce the time to scan in, it does reduce the scan data by eliminating all the signals required to keep the ENABLE circuits turned off in the example shown in FIG. 10$a$. It also reduces the number of inputs required to transfer the data into the parallel scan chains.

Figure 11:
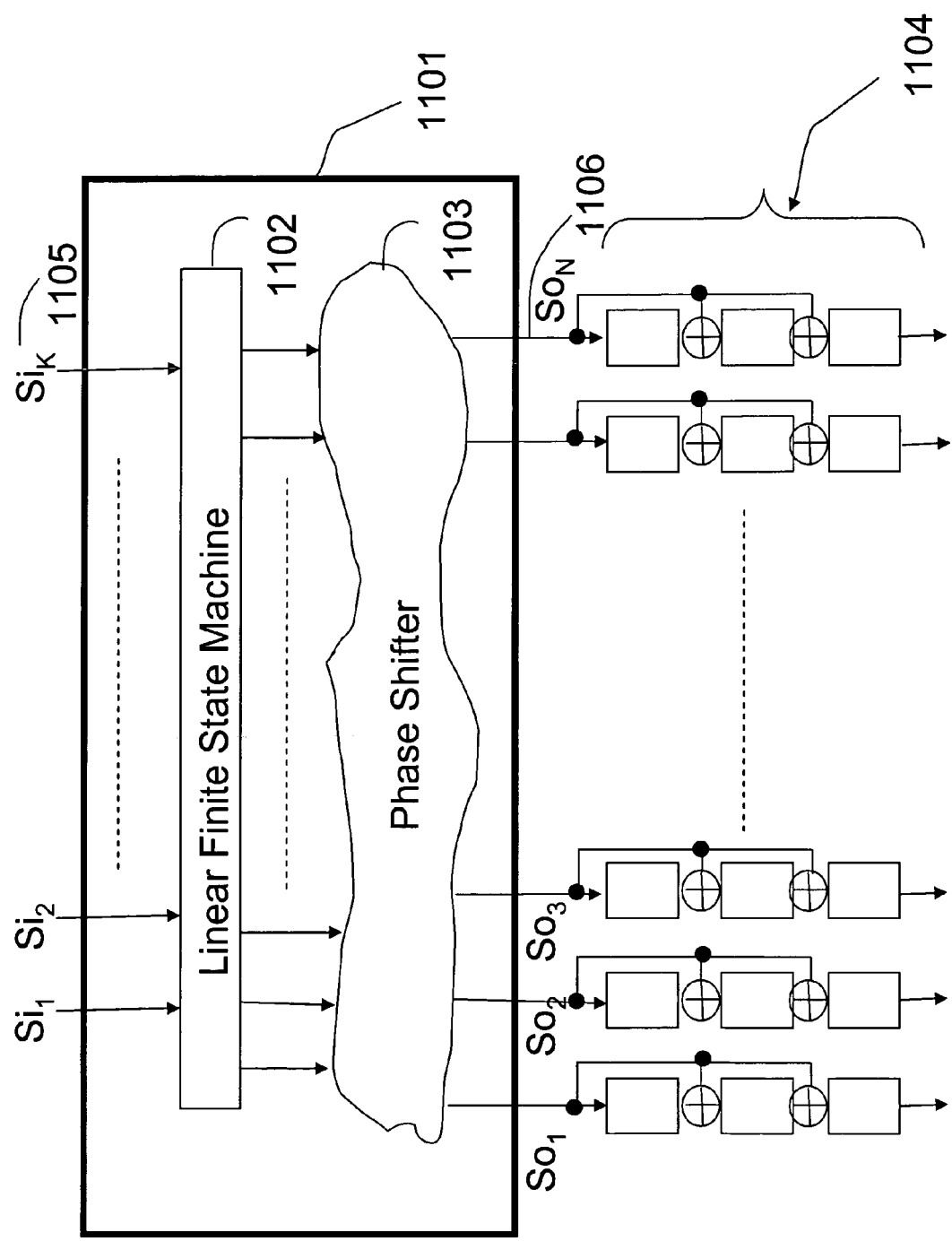
FIG. 11 shows a data spreading network that takes in serial data along Scan_In ports $Si_1$ through $Si_K$ and expands these to drive its output ports $So_1$ through $So_N$ (N>K) so that only K-many Scan_In ports can be used to provide serial data for N-many parallel scan-chains, where one or more of the parallel scan-chains are implemented using the multiple-segmented scan-chain architecture.

In yet another embodiment, the present invention presented here can also be used together with other scan-based data compression architectures that employ a data-spreading network. A data spreading network, such as shown in FIG. 11, receives serial data at a number of input ports 1105 and spreads these onto a larger number of serial output data ports 1106. This may be achieved by connecting at least some of the serial input ports directly (or through a combinational network) to feed data onto multiple serial output data ports. Another way is to use the serial input ports to enter data into an internal register that may be implemented in the form of a Linear Finite State Machine (LFSM) 1102. Specific bit positions of the internal register and the serial input ports are combined through a combinational network 1103 and drive the values at serial output ports 1106. A data-spreading network may be advantageous since it can be used to drive a given number of scan-chains 1104 using a smaller number of serial input streams 1105. Traditionally, a data-spreading network may be used to feed multiple scan-chains, which are implemented as regular scan-chains that are not broken into multiple segments. Traditional approach to determining the external data sequence (and starting state) that must be supplied for the data spreading network is to compute and express each output of the data spreading network with a Boolean expression and perform symbolic shifting of these expressions into the scan-chains, as described in Rajski, et al in U.S. Pat. No. 6,327,687. Upon completing the loading of the scan-chains (requiring full-length shift of the scan-chains) the Boolean expressions are evaluated to satisfy the desired values at all of the Care_In positions. This approach may become intractable as the number and the length of the scan-chains is increased. Even then, the methodology described in this inventive scan can be used to improve the effectiveness of data compression by producing more compressed results in shorter time. This may be achieved as follows:

a.—Start with the scan-chain values set to the desired values at the Care_In positions and Don't_Care ("d") at all others. Also, set the starting state of any state variables inside the data spreader network using Boolean variables to represent the state variables. For example, if the data spreader network has been implemented using an n-bit Linear Finite State Machine (LFSM) 1102, set each bit of the LFSM to a different Boolean variable (A$_i$, i=1, . . . , n).

b.—Perform symbolic simulations of the scan-chains and the data spreader network in the reverse direction in order to compute the previous state. The state equations (or logic network) of the LFSM 1102 shall be used to determine its previous state in symbolic fashion. For example, the LFSM 1102 may be implemented as a feed-forward LFSM whose characteristic polynomial is a trinomial. Such an LFSM 1102 can be implemented using a regular shift register and an EXOR gate that uses the last bit position and another bit position to produce the serial input value that is feedback into the first bit position of the LFSM 1102. In this case, each previous state of the LFSM can be computed using a reverse-shift of the LFSM 1102 and introducing new values to enter into the last bit position, as may be necessary. Additionally, new EXOR equations may need to be created and added to an ongoing list in order to express the relationships among the newly created symbolic variables and others already being used to represent the present values inside the scan-chain.

c.—Continue the computations as described in step 2 above, for the number of cycles that would be necessary to load all of the scan-chains (i.e. as determined by the number of bits in the longest target scan-chain being to be loaded with the scan values).

d.—Solve the Boolean expressions and the EXOR equations to determine the required starting state of the data spreading network and the serial input stream that feeds it.

As explained above, the efficiency of the improved algorithm also improves the efficiency of data compression when using an architecture that employs a data-spreading network, as described above. Furthermore, accelerated scan can be implemented using a data-spreading network so that multiple scan chains may be loaded in number of shift cycles that is less than the full length of the longest scan-chain. This is illustrated in FIG. 11.

The scan architecture shown in FIG. 11 where a data-spreading network feeds the segmented scan-chains for implementing accelerated scan may offer advantages over using just the segmented scan-chains for implementing accelerated scan. This is because accelerated scan often enables scan test vector compression where the compressed vectors still contain a significant number of don't care values so that it may be possible to generate the multiple Scan_In streams through a properly chosen data spreading network. In this case, overall scan data compression factor that may be achievable is given by:

Data_Compression=$(N/K)$*Comp

Where Comp is data compression achieved by using accelerated scan alone. In other words, it is possible to combine accelerated scan with other data compression approaches, such as using a data-spreading network, in order to achieve overall compression factor that may approach the product of the different approaches that are implemented together.

Compressed Scan_In sequence that is achieved using accelerated scan often contains a significant number of unspecified (i.e. Don't_Care) input values. This suggests that the results can be compressed even further. One approach to achieve such a second order compression is to use an on-chip data-spreading network, as described above.

Figure 12:
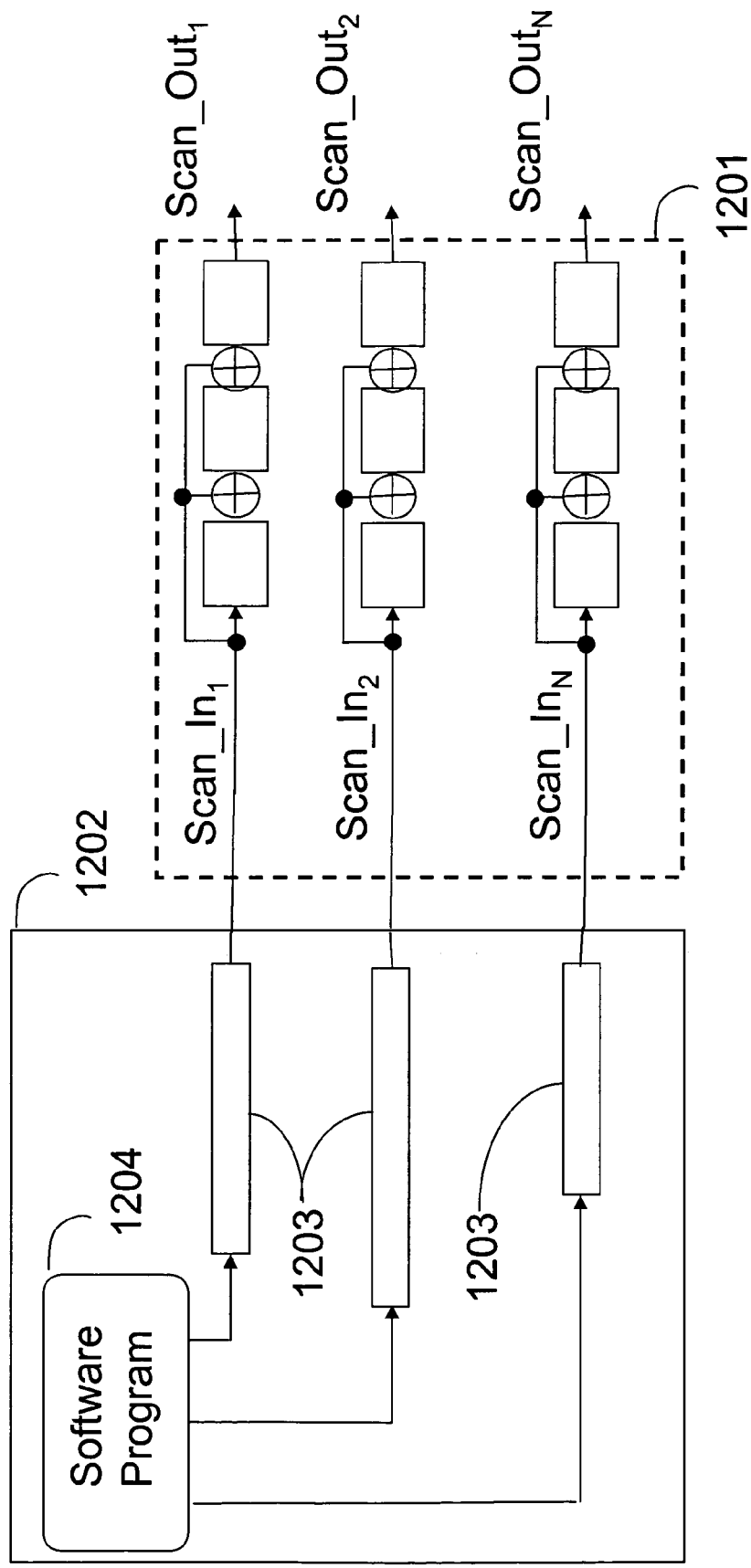
FIG. 12 illustrates including the Automatic Test Equipment (ATE) in the compression loop so that first an ATE-run process is executed in hardware or software (1204) to generate compressed scan-in sequences that are provided as serial inputs to the target IC (1201) whereby on-chip EXOR gates among the segments of the internal scan-chains are used to set the Care_In values as required by each original test vector.

Yet another embodiment of the present invention includes an Automatic Test Equipment (ATE) as part of the overall data compression scheme and is shown in FIG. 12. This is achieved by implementing traditional data compression schemes (e.g. run-length encoding) on the ATE 1202 to be executed either in hardware or software 1204. In this case, second-order (or higher) compressed test vectors are stored on the ATE and are fed as input to the pre-determined decompression scheme (such as run-length encoding) so that the output of the decompression is used as compressed test vectors that are received by the on-chip accelerated scan structure in order to load the Care_In values of the flip-flops on the target IC component.

In a preferred embodiment, this is achieved by using accelerated scan to develop compressed scan-chain patterns, which are then, further compressed using other data compression techniques, such as using run length encoding (RLE). In a typical case, the original scan-chain may contain 4% Care_In values and the compressed scan-in sequence that is obtained using accelerated scan may contain 30%–50% of values set to 0 or 1 and the remaining values are set to Don't_Care. Filling the Don't_Care values in order to obtain long sequences of all 0's and all 1's results in a binary sequence that can be coded using a modified RLE as illustrated in the following example:

Assume that the compressed scan-in sequence is given by:
d,0,d,d,0,d,d,0,d,1,0,1,d,0,1,d,d,d,d,d,1,d,d,d,1,d,d,d,1,d, d,0 (32 bits)
To be compressed using RLE, the Don't_Care values are filled as shown below:
0,0,0,0,0,0,0,0,1,0,1,1,0,1,1,1,1,1,1,1,1,1,1,1,1,1,1,1,1,1,1,0 (32 bits)
Next, a modified RLE is used where:
0 1 indicates a single 0 bit
1 1 indicates a single 1 bit
n n n n 0 0 indicates "nnnn+1" bits consecutive of 0's
n n n n 1 0 indicates "nnnn+1" bits of consecutive 1's
Then, the compressed scan-in sequence can be further compressed using 2/6-bit codes as:
100000, 11,01,11,11,01,111110,11,01 (26 bits)
this indicates (starting from the left) a sequence of
9 zeros, 1 one, 1 zero, 1 one, 1 one, 1 zero, 16 ones, 1 one, 1 zero, that matches the original scan-in sequence of 32 bits.

The total length of the coded compressed scan-chain sequence is 26. This indicates that the coding technique as exemplified above produces further data compression when used on compressed scan-chain sequences that have been compressed using accelerated scan as described in this invention. For the example shown, compression ratio is given by 32/26=1.23. In practice, compression ratio that may be achieved on realistic un-compressed scan-in sequences is typically greater than 1.75 and may be much higher.

For example, in a preferred embodiment of the present invention, run-length encoding (RLE) may be implemented in hardware or software 1204 to be executed by the ATE 1202. In yet another preferred embodiment, software program 1204 is used to implement accelerated scan technique in software. The software implementation, which is illustrated in FIG. 12, contains a (software) Virtual Scan-Chain register 1203 represents a virtual scan-chain whose desired length is the equal to the length of the compressed Scan_In sequence and whose bits are set to the values 0, 1, or d as specified in the Serial_Input sequence. In addition, another Virtual Starting-State register of the same length is defined whose contents are set in deterministic fashion but can be chosen in pseudorandom fashion (i.e. these values may not be related to the particular compressed Scan_In pattern at all). Accelerated scan technique can be used to determine a reduced Virtual Scan_In sequence in order to produce a final state in the Virtual Scan-Chain that equals the compressed Scan_In sequence which is needed to load the actual Scan-Chain of the target IC 1201 whereby all of its Care_In values are set as required for the present test vector. In this case, overall data compression that is achieved becomes the product of the individual compression factors achieved using the actual accelerated scan implementation that uses the actual test vector and the virtual accelerated scan that uses the compressed Scan_In sequence as produced by the former. For example, accelerated scan may be used to compress a test vector of 10,000 bits by a factor of 10, into a 1,000-bit compressed Scan_In sequence and furthermore, the 1,000 bit Scan_In sequence may be compressed by a factor of 1.33 into 750 bits by using a software implementation of accelerated scan on the ATE. This produces an overall data compression of 10×1.33=13.33, but the overall time compression, as measured by the time reduction in loading the target IC's Care_In values, remains the same (i.e. 10).

Figure 13C:
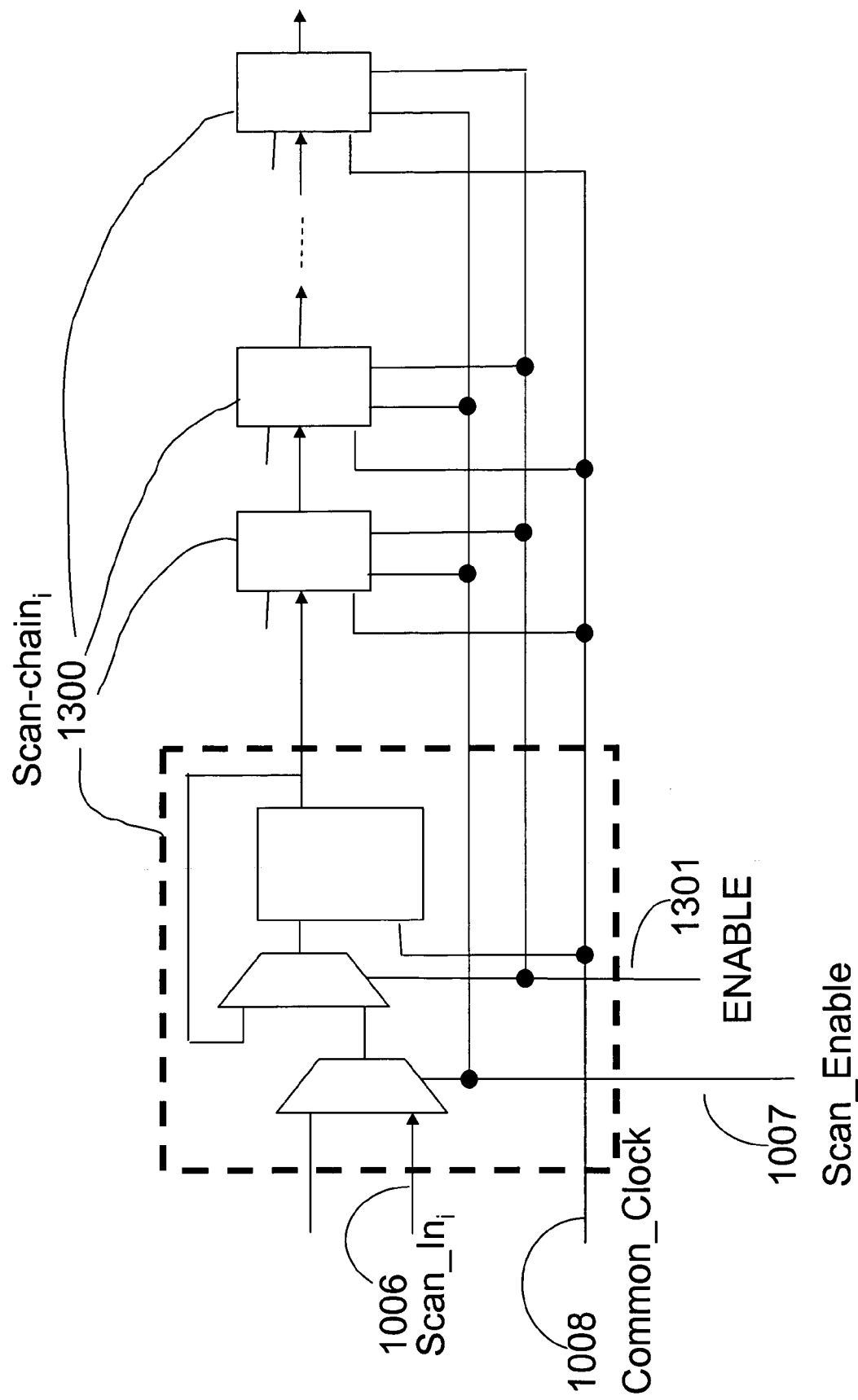
FIG. 13c shows another technique that uses the preferred embodiment of a flip-flop shown in FIG. 14 as well as showing how to connect multiple flip-flops of the shown type together to form a single scan-chain.

FIG. 13 shows three different ways for controlling the scan-chains. FIG. 13a shows using a separate clock signal for each scan-chain. In this case each clock net 1301 is implemented as a separate clock tree. FIG. 13b gates the Common_Clock 1008 with individual ENABLE signals to control the clock signals 1009 to the flip-flops on each scan-chain. As in the previous solution, each clock net 1009 is implemented as a separate clock tree. Hence, in both cases, a separate clock distribution network is implemented to carry the clock signals to all elements of each scan-chain. In FIG. 13a signal nets $clock_k$ through $clock_j$ 1301 must each be routed as a separate clock net in order to achieve equal propagational delays from each clock source to each of the leaf points along the clock-net. Similarly, the gated-clock signals 1009 must be balanced in the same fashion. Furthermore, it is necessary to balance the delays through the separate clock networks in order minimize clock skew so that system performance (i.e. operating frequency) can be maximized. This problem becomes increasingly difficult to solve with increasing number of separately operable clock networks. FIG. 13c shows an alternate implementation that uses individual flip-flops 1300 that have an ENABLE input 1301 to keep the present-state of the flip-flop from changing by circulating the previous value of the flip-flop back. This approach enables using a Common_Clock 1008 signal for all scan-chains and uses the individual ENABLE signals to control the behavior of each flip-flop so that the present state is re-circulated (if the scan-chain is not enabled) or new data (e.g. scan data) is admitted into the flip-flop if the scan-chain has been enabled. This approach does not require implementing a separate clock network for each scan-chain, but it does add additional propagational delay into the data path, which may affect performance of the target IC. Furthermore, a separate ENABLE signal 1301 needs to be routed to each flip-flop. In addition to taking up valuable routing resources, this also requires minimizing the delay through the ENABLE networks and balancing the different ENABLE signals 1301 with each other in order to allow operating the multiple scan-chains at higher speeds.

Figure 14:
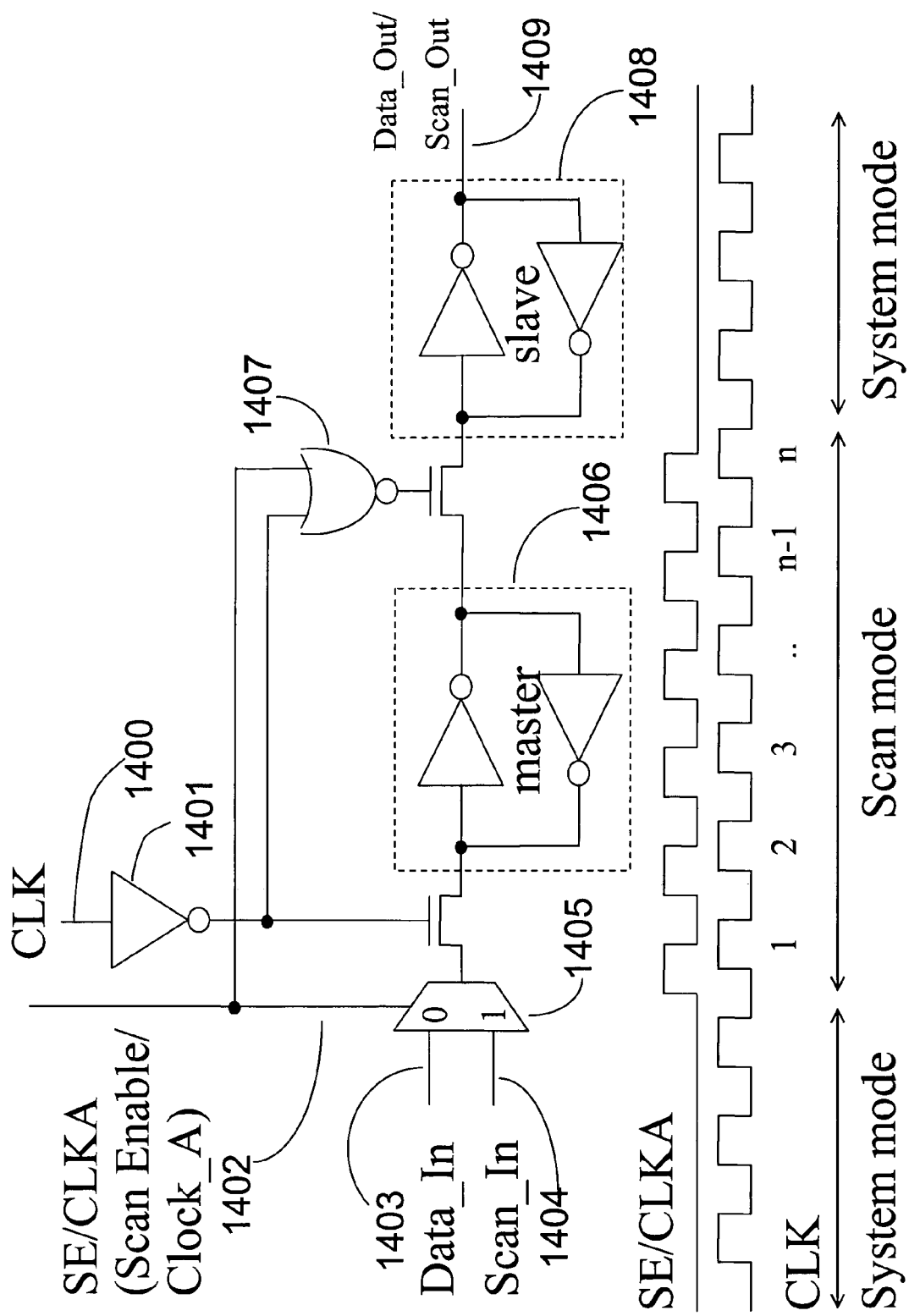
FIG. 14 shows a preferred embodiment for the design of a flip-flop that uses the SE/CLKA port to receive a common control signal that can be used as the Scan_Enable signal as well as CLKA signal to perform scan operation.

The present invention addresses all of the problems exemplified in FIG. 13a through 13c by providing the design for a new flip-flop, as shown in FIG. 14.

The preferred embodiment of the flip-flop as shown in FIG. 14 operates as follows. When the SE/CLKA (Scan_Enable/Clock_A) signal 1402 is set to logic 0, it allows selecting Data_In 1403 as the normal (i.e. system) data input for the flip-flop so that the Data_In 1403 signal enters into the master latch 1406 when the clock signal CLK 1400 is low. Present data value of master latch 1406 is transferred into the slave latch on the rising-edge of CLK 1400. Each of master latch 1406 and slave latch 1408 passes an inverted value of data at its input terminal to its output terminal, but the even number of signal inversions between the Data_In 1403 or the Scan_In 1404 input port and the Data_Out/Scan_Out 1409 output terminal ensure that the flip-flop captures and outputs true polarity of values of Data_In or Scan_In input values. To perform scan operations, first the SE/CLKA (i.e. Scan_Enable) signal 1402 is set to logic 1 so that Scan_In 1404 is allowed to enter into the master latch 1406 when CLK 1400 is low. Inverter 1401 is used to invert the CLK signal 1400 and since NOR-gate 1407 output remains at logic 0 if SE/CLKA is set to logic 1 or CLK is set to logic 0, present data in the master latch 1406 is not transferred into the slave latch 1408 while SE/CLKA 1400 remains asserted at logic 1 even if the CLK 1400 signal may become set to logic 1. The captured Scan_In data is transferred into the slave latch 1408 when both the SE/CLKA 1402 is returned to logic 0 and CLK 1400 is set to logic 1. Finally, setting CLK 1400 to logic 0 enables the master latch 1406 again so that the next Scan_In 1404 value can be stored in the master latch 1406 when SE/CLKA 1402 becomes asserted at logic 1. Stated in a different fashion, the flip-flop shown in FIG. 14 has the following properties:

When SE/CLKA 1402 is asserted at logic 0, the flip-flop responds to the data presented at the Data_In port 1403 by reflecting the Data_In value at the Data_Out port 1409 on each rising-edge of the CLK signal 1400.

Scan operations are performed using CLK 1400 and SE/CLKA 1402 as two separate clock signals such that Scan_In occurs into the master latch 1406 when CLK 1400 is set to logic 0 and SE/CLKA 1402 is set to logic 1. Scan_Out occurs into the slave latch 1408 when CLK 1400 is set to logic 1 and SE/CLKA 1402 is set to logic 0. Thus, the flip-flop shown in FIG. 14 has the desirable property of being immune to hold-time violations, which is characteristic of flip-flops operating under control of multiple, non-overlapping clocks.

The SE_CLK_A 1402 input can be used as an ENABLE control signal 1301 even for normal (i.e. functional) system operation since, setting SE/CLKA 1402 to logic 1 prior to setting CLK 1400 to logic 1 maintains the present slave latch 1408 and the Data_Out port 1409 signal at their previous values.

In one aspect of the present invention, the preferred embodiment of the flip-flop shown in FIG. 14 enables controlling two separate functions using a single control line 1402. This is advantageous because it eliminates the need to route separate control signals for Scan_Enable 1007 and ENABLE 1301 by combining their actions on a single control signal labeled SE/CLKA 1402. Yet another aspect of present invention is that SE/CLKA 1402 signal acts as a control signal while CLK 1300 is set to logic 0 and acts as a clock signal when CLK 1300 is set to logic 1. This allows using the flip-flop depicted in FIG. 14 in a fashion where CLK 1300 is used to scan the master latch 1406 and SE_CLK_A 1400 is used to clock the slave latch 1408 in mutually-exclusive fashion so that scan operations can be performed free from hold-time violations. In yet another aspect of present invention the flip-flop depicted in FIG. 14 can be used so that SE/CLKA 1402 can be set to logic 1 during normal system operation in order to prevent the flip-flop state from changing when the rising-edge of the clock signal CLK 1400 is applied.

FIG. 14 shows a preferred embodiment of the flip-flop of the present invention where the flip-flop responds to the rising-edge of the clock signal CLK 1400, but it is straightforward to those knowledgeable in design to modify the circuitry shown in FIG. 14 so that the flip-flop can operate on the falling-edge of its clock input CLK 1400.

Figure 15A:
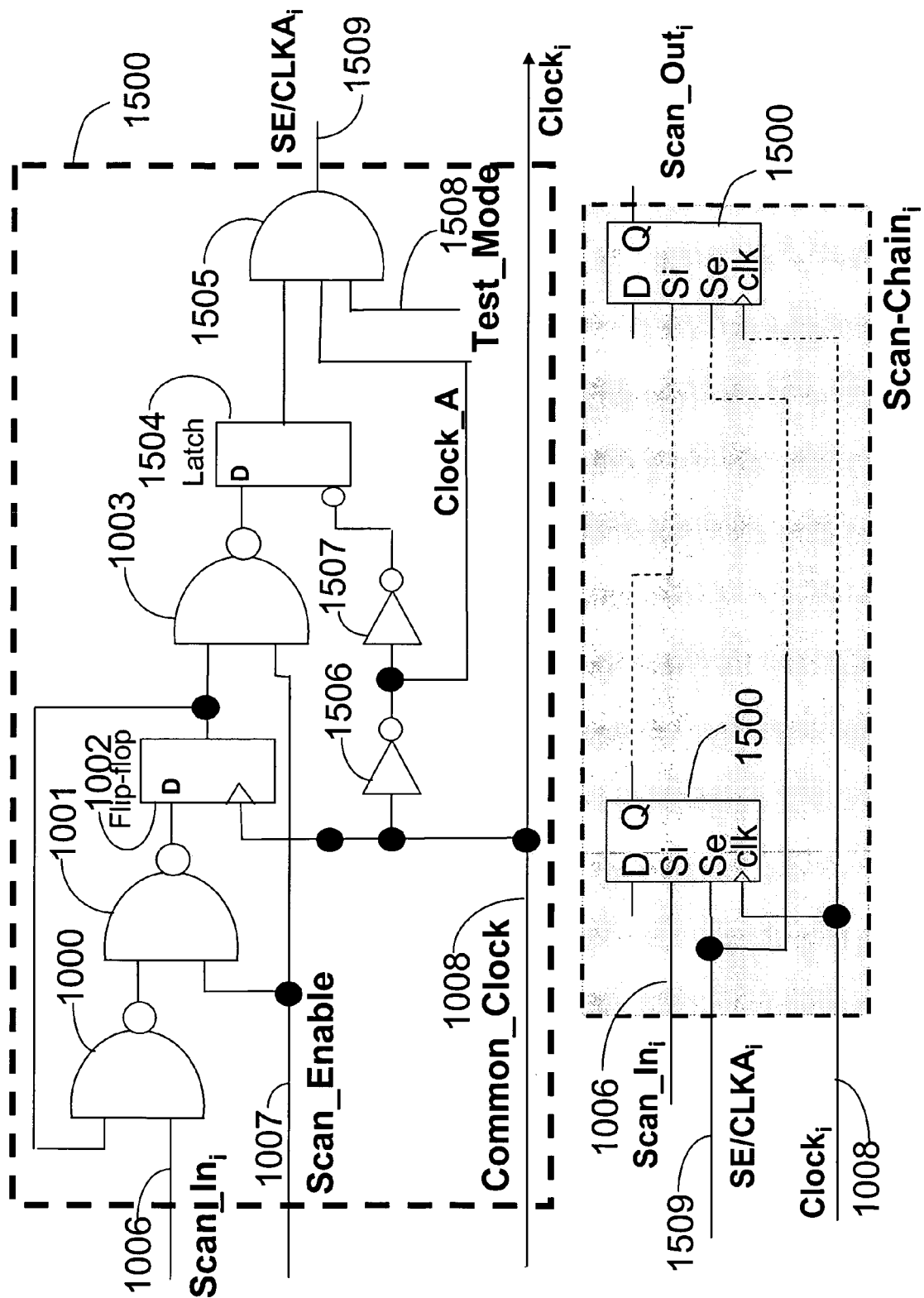
FIG. 15a shows an example that demonstrates using a modified version of the clock-control circuit shown in FIG. 10 together with the flip-flop illustrated in FIG. 14 so that a common clock signal can be shared among multiple scan-chains operating in parallel.
Figure 15B:
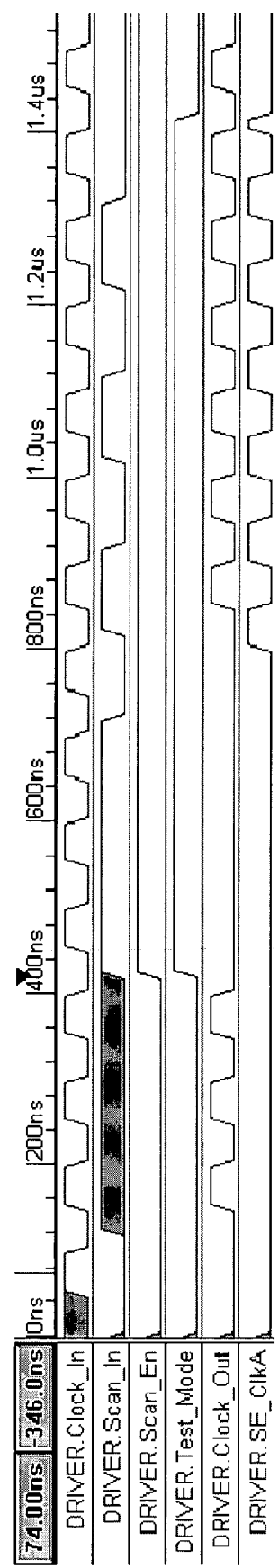
Figure 15C:
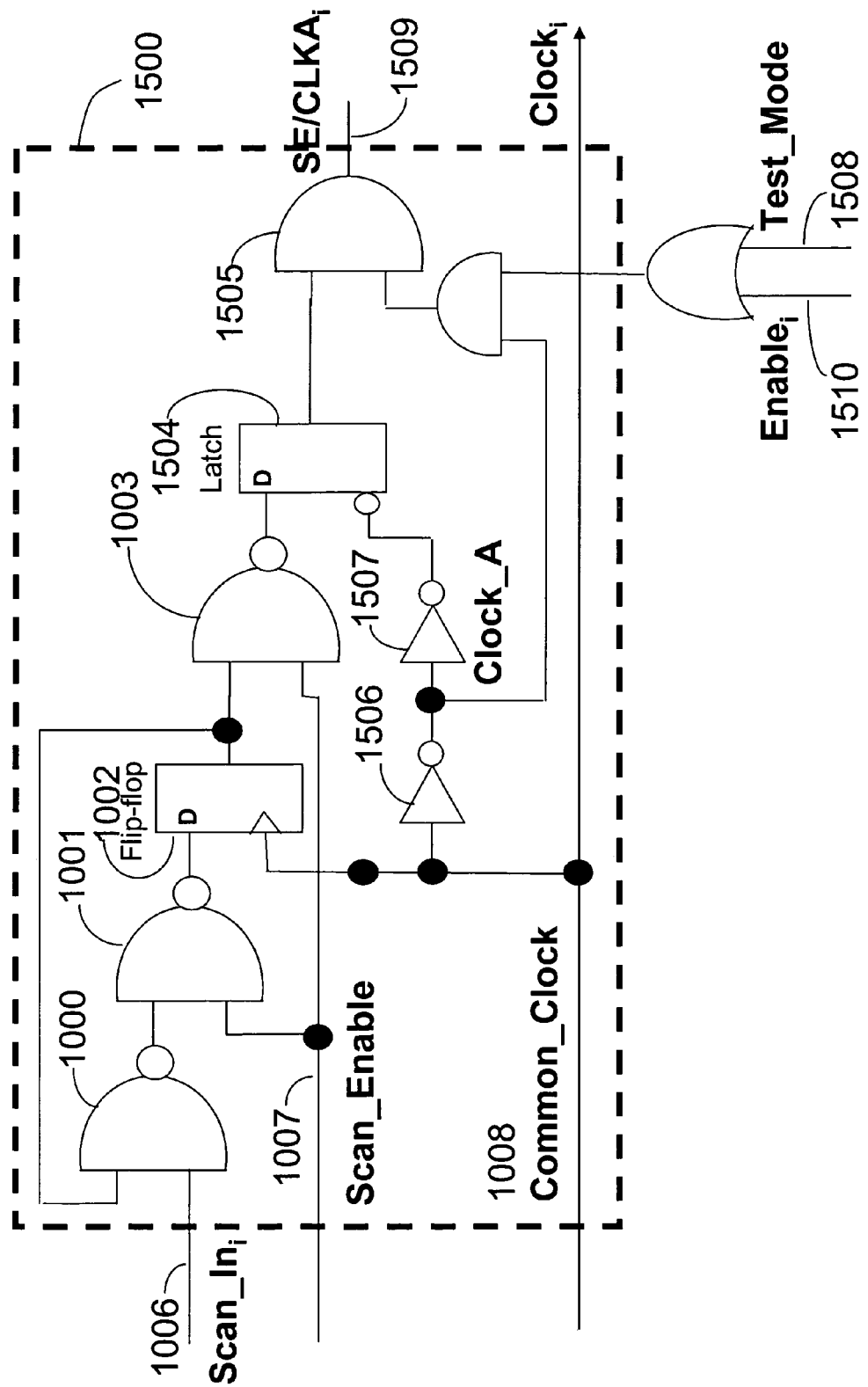
FIG. 15c shows a modified control signal that incorporates a functional Enable control signal to control updating of individual flip-flops with new data during normal mode of operation. Test_Mode signal (1508) is used to disable the affect of the functional enable control signal (1510) when the circuit is placed in a test mode so that scan operations may be possible.

In another embodiment, FIG. 15a shows an example of how the SE/CLKA signal 1502 may be generated so it can be used to control flip-flops on the same scan-chain. The circuit in FIG. 15a represents a modification of preferred embodiment of circuit shown in FIG. 10a whereby AND-gate 1505 is used to gate output of latch 1504. AND-gate 1505 receives inputs from latch 1504, and the Test_Mode signal 1508 along with output of inverter 1506, which provides the complemented version of Common_Clock 1008. Inverters 1506 and 1507 also work to delay the clock input to the latch 1504 in order to prevent unwanted transient signals on the SE/CLKA 1509. FIG. 15b shows a preferred way to use circuit of FIG. 15a to control a given scan-chain FIG. 15c shows an improvement to circuit in FIG. 15a and adds a functional control signal, $Enable_i$ 1510 whereby Enables can be used to prevent the flip-flop contents from being updated with new data during normal mode of operation. In a preferred embodiment as shown in FIG. 15c Test_Mode signal 1508 is used to disable the affect of the functional enable control signal 1510 when the circuit is placed in a test mode so that scan operations may be possible. This circuit works by setting Scan_Enable 1007 to logic 0 and setting Test_Mode 1508 to logic 1 and using Enables 1510 to control each individual flip-flop "I" 1500 so it can be updated with new data or remain unchanged when clock signal $clock_i$ 1008 is applied.

Figure 17A:
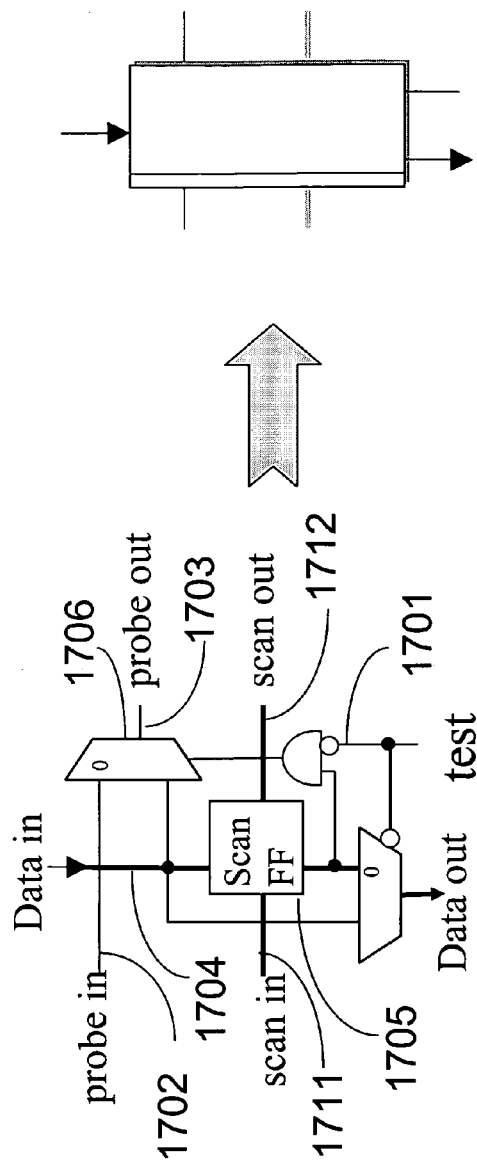
FIG. 17a shows an embodiment of a boundary scan flip-flop.
Figure 17B:
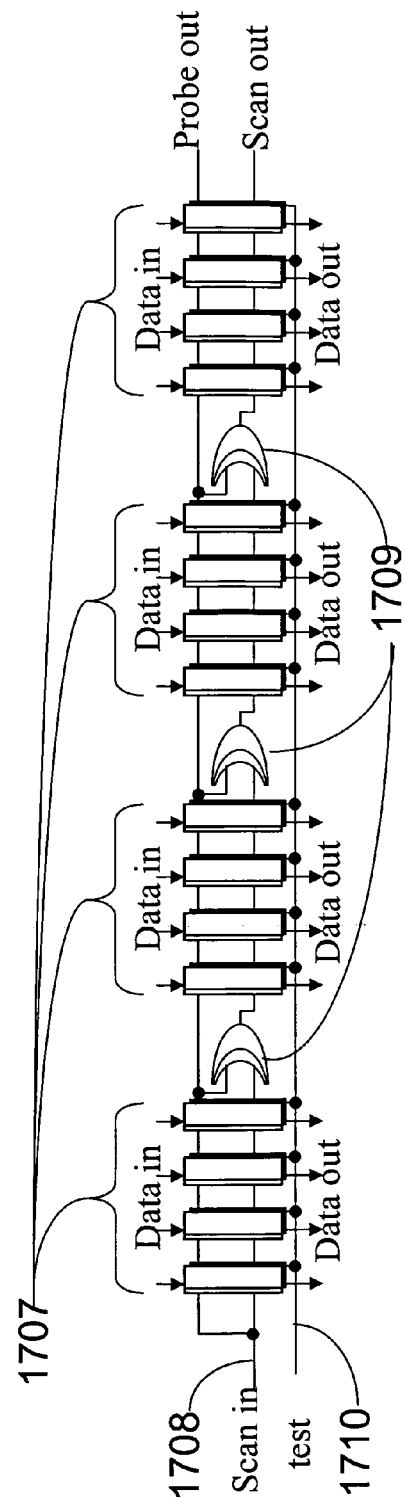
FIG. 17b shows a preferred embodiment that includes the boundary scan flip-flop, shown in FIG. 17a, between scan segments in the boundary scan chain.

In another embodiment of the invention, compression can be performed on boundary scan chains as well as internal scan chains. Furthermore, if the boundary scan flip-flop disclosed in Applicants' co-pending U.S. patent application Ser. No. 09/275,726, is adapted as shown in FIG. 17a and is used in the boundary scan chains, the probe in 1702 and probe out 1703 ports can be connected together such that they can perform both a probe function and a test pattern decompression function. During normal system operation;

the test port 1701 is low, a signal on the Data in port 1704 bypasses the scan flip-flop 1705, and the contents of the scan flip-flop 1705, previously loaded via a scan operation, determines whether the probe multiplexor 1706 propagates the previous probed signal from Probe in 1702 to probe out 1703 ports, or the signal on the Data in port 1704 is selected to be probed. In this mode, the contents of the boundary scan can select one of the Data in signals entering the boundary scan to be probed during normal system operation. During test operation, the test port 1701 is high, the boundary scan flip-flop captures the signal on the Data in port 1704, and the signal on the test port 1701 forces the probe multiplexor 1706 to propagate the signal from the probe in 1702 to probe out 1703 ports Multiple copies of this boundary scan flip-flop can be connected into multiple scan segments 1707 that form a complete scan chain, as shown in FIG. 17b by; connecting all test ports to a common test signal 1710, connecting each successive boundary scan flip-flop's probe in port 1702 and Scan in port 1711 to the previous boundary scan flip-flop's probe out port 1703 and scan out port 1712 respectively, connecting the first boundary scan flip-flop's probe in port 1702 to the scan in signal 1708, and connecting the probe out signals of the last boundary scan flip-flop in each scan segment 1707 to the functions 1709 between the scan segments 1707. In this fashion, during test operation, compressed patterns can be applied to the boundary scan chains, using the same logic and wiring used to probe the boundary scan flip-flops' data in signals during system operation.

Architecture, circuitry, and methodology described herein show using accelerated scan as a way to obtain and use shorter length Scan_In sequences to set all of the Care_In values in longer length scan-chains. Typically, data compression using this approach may be in the range from 2× to 30×, though higher compression factors may also be possible. The fact that a high percentage of bit positions in scan-based test vectors may be set to don't care values leads to a high expected value for data compressions such that a longer scan-chain may be controlled using, say, $\frac{1}{30}^{th}$ of full-length Scan_In sequences. The relative ease with which a segmented scan-chain may be loaded with a valid test vector leads to the conclusion that not only pre-determined compressed Scan_In sequences but also Scan_In sequences that may be generated using pseudo-random techniques may be good sources of test data for providing serial inputs to segmented scan-chains similar to those described above. The advantage of using such an approach would be to drive the scan-chains with on-chip (or off-chip) pseudo-random generators such that the pseudo-random input sequences are shorter in number of bits than the total length of the scan-chains that they drive. This means that even more pseudo-random test patterns may be applied within a given number of test cycles, which is a distinct goal and advantage of present invention.

Figure 18:
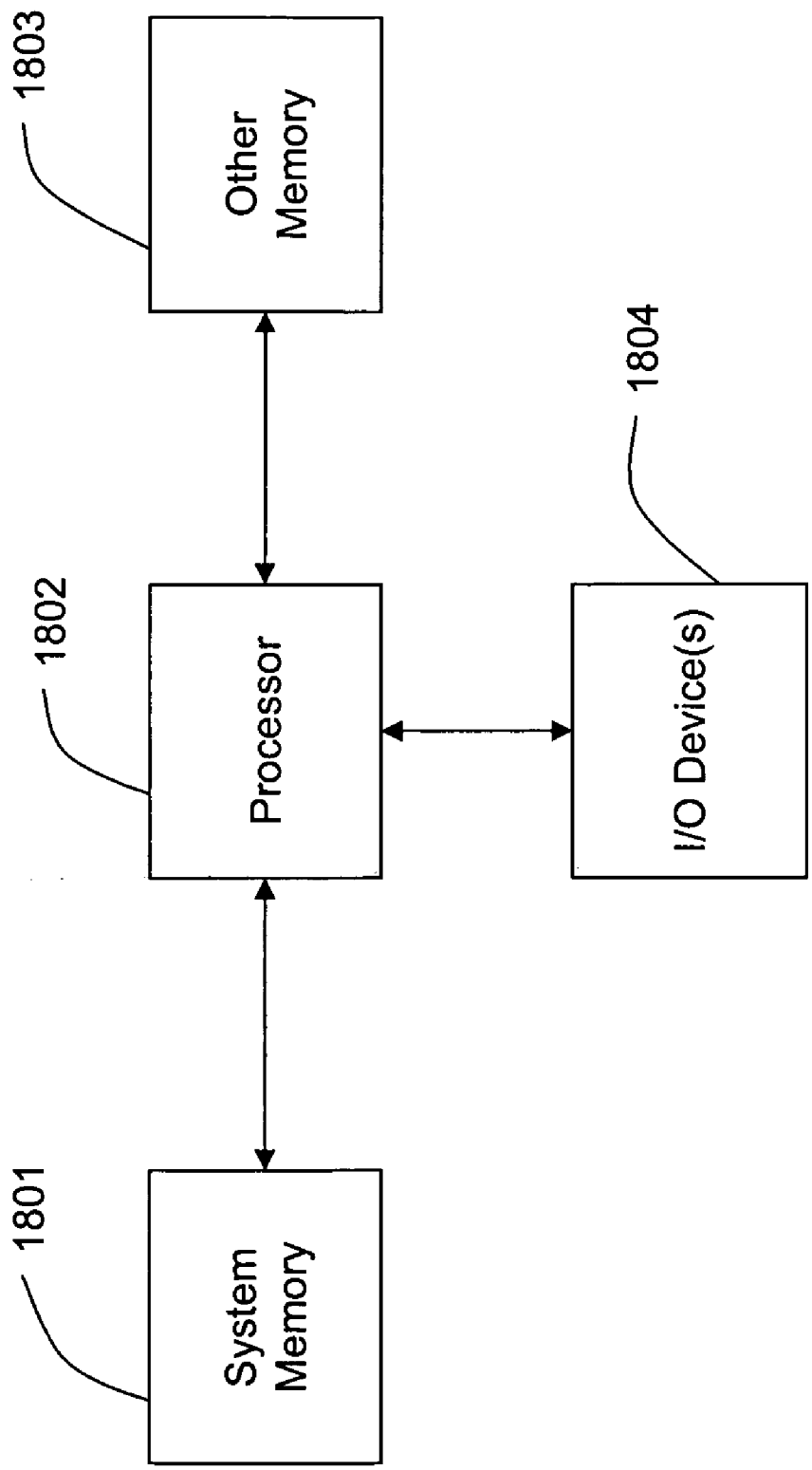
FIG. 18 shows an alternative embodiment of at least some aspects of the invention.

Some embodiments of the invention, as discussed above, may be embodied in the form of software instructions on a machine-readable medium. Such an embodiment is illustrated in FIG. 18. The computer system of FIG. 18 may include at least one processor 1802, with associated system memory 1801, which may store, for example, operating system software and the like. The system may further include additional memory 1803, which may, for example, include software instructions to perform various applications. The system may also include one or more input/output (I/O) devices 1804, for example (but not limited to), keyboard, mouse, trackball, printer, display, network connection, etc. The present invention may be embodied as software instructions that may be stored in system memory 1801 or in additional memory 1803. Such software instructions may also be stored in removable or remote media (for example, but not limited to, compact disks, floppy disks, etc.), which may be read through an I/O device 1804 (for example, but not limited to, a floppy disk drive). Furthermore, the software instructions may also be transmitted to the computer system via an I/O device 1804, for example, a network connection; in such a case, a signal containing the software instructions may be considered to be a machine-readable medium.

We claim:

1. A scan flip-flop, comprising:
   a Scan_In port;
   a Data_In port;
   a Scan_Enable port;
   a CLK port;
   a Data_Out port; and
   having a means to:
   capture data from said Data_In port in one state of a signal on said Scan_Enable port by applying a change to a signal on said CLK port thereby changing said signal on said CLK port to a pre-defined CLK state;
   capture data from said Scan_In port in a different state of the signal on said Scan_Enable port by applying said change to said signal on said CLK port, thereby changing it to said pre-defined CLK state;
   disable loading data from either of said Scan_In port and said Data_In port in a state other than said pre-defined CLK state of said signal on said CLK port; and
   enable reflecting captured data at said Data_Out port by applying said state other than said pre-defined CLK state on said CLK port combined with applying said one state of a signal on said Scan_Enable port, reflected data on said Data_Out port being held constant at other times.

2. A multiplicity of scan flip-flops according to claim 1, said scan flip-flops incorporated into a circuit structure comprising:
   a multiplicity of scan-chains, wherein at least one of said scan-chains comprises a multiplicity of said scan flip-flops, at least one said Scan_Enable port of at least one said scan flip-flop being coupled to a control signal wherein:
   in one state, said control signal provides information to select operation of said flip-flop responsive to said Scan_In port or responsive to said Data_In port; and
   in another state, said control signal provides information to select operation of said flip-flop to reflect said captured data at its Data_Out port.

3. A boundary scan flip-flop comprising:
   a data-in port;
   a data-out port;
   a scan-in port;
   a scan-out port;
   a probe-in port;
   a probe-out port;
   a test port; and
   a flip-flop structure;
   wherein said flip-flop structure and at least a subset of said ports are adapted to implement at least;
   a system operation mode, enabled by one state of said test port, wherein said boundary scan flip-flop propagates a data value of a signal from said data-in port to said data-out port, wherein the propagation of the data value of a signal from said data-in port to said data-out port includes choosing to propagate the data value of a signal from said data-in port, as opposed to a data value of a signal from said probe-in port, based on a state of said flip-flop structure; and a test operation mode, enabled by a different state of said test port, wherein said boundary scan flip-flop propagates a data value of a signal from said probe-in port to said probe-out port, and captures a data value of a signal on said data-in port for shifting out through said scan-in and scan-out ports.

4. The boundary scan flip-flop as in claim 3, further comprising:

a first multiplexer adapted to be coupled to said data-in port and to said flip-flop, an output of said first multiplexer adapted to be coupled to said data-out port, the first multiplexer adapted to be responsive to a signal from said test port; and a second multiplexer adapted to be coupled to said probe-in port and to said data-in port, an output of the second multiplexer adapted to be coupled to said probe-out port, the second multiplexer adapted to be responsive to said signal from said test port.

5. The boundary scan flip-flop as in claim 4, further comprising:

a logic gate coupled to said flip-flop and to said test port, an output of said logic gate adapted to provide a select input to said second multiplexer.

6. A multiplicity of boundary scan flip-flops as in claim 3, connected to form a multiplicity of boundary scan chains, wherein at least one of said boundary scan-chains contains a multiplicity of scan segments such that any data in port of any boundary scan flip-flop may be probed during system operation.

7. A multiplicity of boundary scan flip-flops as in claim 6, wherein at least one compressed test pattern is used during said test operation mode.

* * * * *